US012382775B2

(12) United States Patent
Sykes et al.

(10) Patent No.: US 12,382,775 B2
(45) Date of Patent: *Aug. 5, 2025

(54) COMPOUND CHARGE TRANSPORT LAYER FOR ORGANIC PHOTOVOLTAIC DEVICES

(71) Applicant: Ubiquitous Energy, Inc., Redwood City, CA (US)

(72) Inventors: Matthew E. Sykes, Chicago, IL (US); Miles C. Barr, Redwood City, CA (US); Richa Pandey, Sunnyvale, CA (US); John A. Love, Mountain View, CA (US)

(73) Assignee: Ubiquitous Energy, Inc., Redwood City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,951

(22) Filed: Nov. 8, 2023

(65) Prior Publication Data

US 2024/0349522 A1  Oct. 17, 2024

Related U.S. Application Data

(63) Continuation of application No. 17/166,974, filed on Feb. 3, 2021, now Pat. No. 11,839,095.

(Continued)

(51) Int. Cl.
*H10K 30/82* (2023.01)
*H10K 30/30* (2023.01)
(Continued)

(52) U.S. Cl.
CPC .......... *H10K 30/85* (2023.02); *H10K 30/353* (2023.02); *H10K 30/82* (2023.02); *H10K 30/86* (2023.02);
(Continued)

(58) Field of Classification Search
CPC ...... H01L 31/00–078; Y02E 10/50–60; H10K 30/50–89; H10F 10/00–19; H10F 19/00–908
(Continued)

(56) References Cited

U.S. PATENT DOCUMENTS 9,391,287 B1  7/2016  Huang et al.
11,839,095 B2 * 12/2023  Sykes .................... H10K 30/86
(Continued)

FOREIGN PATENT DOCUMENTS

CN  108288676 A  7/2018
CN  109768167 A  5/2019
(Continued)

OTHER PUBLICATIONS

WO-2019039779-A1 English (Year: 2019).*
(Continued)

*Primary Examiner* — Bach T Dinh
(74) *Attorney, Agent, or Firm* — Kilpatrick Townsend & Stockton LLP

(57) ABSTRACT

Organic photovoltaic devices with compound charge transport layers are described herein. One such device includes a substrate, a first electrode coupled to the substrate, a second electrode disposed above the first electrode, and photoactive layers disposed between the first electrode and the second electrode. The device further includes a compound charge transport layer disposed between the photoactive layers and either the first electrode or the second electrode. The compound charge transport layer includes a charge transport layer and a metal-oxide interlayer disposed between the charge transport layer and the photoactive layers. The charge transport layer may be a hole transport layer or an electron transport layer.

19 Claims, 36 Drawing Sheets

Related U.S. Application Data

(60) Provisional application No. 62/970,010, filed on Feb. 4, 2020.

(51) Int. Cl.
*H10K 30/85* (2023.01)
*H10K 30/86* (2023.01)
*H10K 30/20* (2023.01)
*H10K 85/30* (2023.01)
*H10K 85/60* (2023.01)

(52) U.S. Cl.
CPC ............ *H10K 30/211* (2023.02); *H10K 30/30* (2023.02); *H10K 85/324* (2023.02); *H10K 85/371* (2023.02); *H10K 85/381* (2023.02); *H10K 85/631* (2023.02)

(58) Field of Classification Search
USPC .................................................. 136/243–265
See application file for complete search history.

(56) References Cited

U.S. PATENT DOCUMENTS

| | | | |
|---|---|---|---|
| 2008/0035965 | A1 | 2/2008 | Hayashi et al. |
| 2015/0144195 | A1 | 5/2015 | Irwin et al. |
| 2016/0013424 | A1 | 1/2016 | Yamamoto et al. |
| 2016/0365526 | A1 | 12/2016 | Manceau et al. |
| 2017/0186984 | A1 | 6/2017 | Hosono et al. |
| 2018/0366648 | A1 | 12/2018 | Barr et al. |
| 2018/0366654 | A1* | 12/2018 | Barr .................... H10K 85/621 |
| 2019/0103570 | A1 | 4/2019 | Hammond et al. |
| 2019/0190438 | A1 | 6/2019 | Hack et al. |
| 2021/0198188 | A1* | 7/2021 | Yoon .................... H10K 30/152 |

FOREIGN PATENT DOCUMENTS

| | | | | |
|---|---|---|---|---|
| JP | 2015046596 | A | 3/2015 | |
| JP | 2017506815 | A | 3/2017 | |
| JP | 2017147315 | A | 8/2017 | |
| JP | 2018018905 | A | 2/2018 | |
| JP | 2018200939 | A | 12/2018 | |
| JP | 2019503072 | A | 1/2019 | |
| WO | 2010134432 | A1 | 11/2010 | |
| WO | WO-2019039779 | A1 * | 2/2019 | ......... H01L 31/0256 |
| WO | 2019116977 | A1 | 6/2019 | |
| WO | WO-2020017739 | A1 * | 1/2020 | ........... C07C 255/41 |
| WO | 2021034715 | A1 | 2/2021 | |

OTHER PUBLICATIONS

"English translation of CN108288676", Jul. 17, 2018, 10 pages.
"WO 2019039779 English", Feb. 28, 2019, 24 pages.
U.S. Appl. No. 17/166,974, "Advisory Action", Jan. 12, 2023, 3 pages.
U.S. Appl. No. 17/166,974, "Final Office Action", Nov. 4, 2022, 11 pages.
U.S. Appl. No. 17/166,974, "Non-Final Office Action", Jun. 22, 2022, 13 pages.
U.S. Appl. No. 17/166,974, "Non-Final Office Action", Mar. 30, 2023, 15 pages.
U.S. Appl. No. 17/166,974, "Notice of Allowance", Jul. 20, 2023, 7 pages.
CA3166881, "Office Action", Aug. 25, 2023, 4 pages.
EP21750843.1, "Extended European Search Report", Jan. 29, 2024, 7 pages.
PCT/US2021/016362, "International Preliminary Report on Patentability", Aug. 18, 2022, 7 pages.
PCT/US2021/016362, "International Search Report and the Written Opinion", May 5, 2021, 9 pages.
JP2022-547120, "Office Action", Feb. 3, 2025, 5 pages.

* cited by examiner

COMPOUND CHARGE TRANSPORT LAYER FOR ORGANIC PHOTOVOLTAIC DEVICES

CROSS-REFERENCES TO RELATED APPLICATIONS

This application is a continuation of U.S. patent application Ser. No. 17/166,974, filed Feb. 3, 2021, issued as U.S. Pat. No. 11,839,095, which claims the benefit of and priority to U.S. Provisional Patent Application No. 62/970,010, filed Feb. 4, 2020, the entire contents of which are incorporated herein by reference for all purposes.

BACKGROUND OF THE INVENTION

Photovoltaic devices are commonly employed to convert light into electricity by using the photovoltaic effect, in which absorbed light causes the excitation of an electron or other charge carrier to a higher-energy state. The separation of charge carriers of opposite types leads to a voltage that can be utilized by an external circuit. Photovoltaic devices, such as photovoltaic solar cells, can be packaged together to constitute a photovoltaic array of a larger photovoltaic system, such as a solar panel. The use of photovoltaic systems to generate electricity is an important form of renewable energy that continues to become a mainstream electricity source worldwide.

The surface area necessary to take advantage of solar energy remains an obstacle to offsetting a significant portion of non-renewable energy consumption. For this reason, low-cost, transparent, organic photovoltaic (OPV) devices that can be integrated onto window panes in homes, skyscrapers, and automobiles are desirable. For example, window glass utilized in automobiles and architecture are typically 70-80% and 40-80% transmissive, respectively, to the visible spectrum, e.g., light with wavelengths from about 450 to 650 nm. The limited mechanical flexibility, high module cost and, more importantly, the band-like absorption of inorganic semiconductors limit their potential utility to transparent solar cells.

SUMMARY OF THE INVENTION

The present disclosure relates to organic photovoltaic devices (OPVs), and in some embodiments, visibly transparent photovoltaic devices incorporating visibly transparent photoactive compounds. The visibly transparent photoactive compounds absorb light more strongly in the near-infrared and/or ultraviolet regions and less strongly in the visible region, permitting their use in visibly transparent photovoltaic devices. The disclosed visibly transparent photovoltaic devices include visibly transparent electrodes with visibly transparent photoactive materials positioned between the visibly transparent electrodes.

The optical characteristics of organic and molecular semiconductors result in absorption spectra that are highly structured with absorption minima and maxima that are uniquely distinct from the band absorption of their inorganic counterparts. However, while a variety of organic and molecular semiconductors exist, many exhibit strong absorption in the visible spectrum and thus are not optimal for use in window glass-based photovoltaics.

A summary of the present invention is provided in reference to various examples given below. As used below, any reference to a series of examples is to be understood as a reference to each of those examples disjunctively (e.g., "Examples 1-4" is to be understood as "Examples 1, 2, 3, or 4").

Example 1 is an organic photovoltaic device comprising: a substrate; a first electrode coupled to the substrate; a second electrode disposed above the first electrode; one or more photoactive layers disposed between the first electrode and the second electrode; and a compound charge transport layer disposed between the one or more photoactive layers and either the first electrode or the second electrode, wherein the compound charge transport layer includes: a charge transport layer; and a metal-oxide interlayer (IL) disposed between the charge transport layer and the one or more photoactive layers.

Example 2 is the organic photovoltaic device of example(s) 1, further comprising: a second compound charge transport layer coupled to the compound charge transport layer, wherein the second compound charge transport layer includes: a second charge transport layer; and a second metal-oxide interlayer coupled to the second charge transport layer and disposed between the second charge transport layer and the one or more photoactive layers.

Example 3 is the organic photovoltaic device of example(s) 1, wherein the first electrode is an anode and the second electrode is a cathode.

Example 4 is the organic photovoltaic device of example(s) 1, wherein the charge transport layer is a hole transport layer (HTL).

Example 5 is the organic photovoltaic device of example(s) 1, further comprising: a metal-oxide charge-injection layer disposed between the first electrode and the compound charge transport layer.

Example 6 is the organic photovoltaic device of example(s) 1, wherein the first electrode is a cathode and the second electrode is an anode.

Example 7 is the organic photovoltaic device of example(s) 1, wherein the charge transport layer is an electron transport layer (ETL).

Example 8 is the organic photovoltaic device of example(s) 1, further comprising: a metal-oxide charge-injection layer disposed between the compound charge transport layer and the second electrode.

Example 9 is the organic photovoltaic device of example(s) 1-8, wherein the one or more photoactive layers includes a bulk heterojunction photoactive layer comprising a blend of an electron donor material and an electron acceptor material.

Example 10 is the organic photovoltaic device of example(s) 1-9, wherein the organic photovoltaic device is visibly transparent.

Example 11 is the organic photovoltaic device of example(s) 1-10, wherein the charge transport layer has distinct spectral absorption properties from the one or more photoactive layers.

Example 12 is an organic photovoltaic device comprising: a substrate; a first electrode coupled to the substrate; a second electrode disposed above the first electrode; one or more photoactive layers disposed between the first electrode and the second electrode; and a compound charge transport layer disposed between the first electrode and the one or more photoactive layers, wherein the compound charge transport layer includes: a charge transport layer; and a metal-oxide interlayer coupled to the charge transport layer and disposed between the charge transport layer and the one or more photoactive layers.

Example 13 is the organic photovoltaic device of example(s) 12, further comprising: a second compound charge transport layer coupled to the compound charge transport layer, wherein the second compound charge transport layer includes: a second charge transport layer; and a second metal-oxide interlayer coupled to the second charge transport layer and disposed between the second charge transport layer and the one or more photoactive layers.

Example 14 is the organic photovoltaic device of example(s) 12, wherein the first electrode is an anode, the second electrode is a cathode, and the charge transport layer is a hole transport layer.

Example 15 is the organic photovoltaic device of example(s) 14, further comprising: a metal-oxide hole-injection layer (HIL) disposed between the first electrode and the hole transport layer.

Example 16 is the organic photovoltaic device of example(s) 12, wherein the first electrode is a cathode, the second electrode is an anode, and the charge transport layer is an electron transport layer.

Example 17 is the organic photovoltaic device of example(s) 16, further comprising: a metal-oxide electron-injection layer (EIL) disposed between the first electrode and the electron transport layer.

Example 18 is the organic photovoltaic device of example(s) 12-17, wherein the one or more photoactive layers includes a bulk heterojunction photoactive layer comprising a blend of an electron donor material and an electron acceptor material.

Example 19 is the organic photovoltaic device of example(s) 12-18, further comprising: a p-phenylene layer disposed between the metal-oxide interlayer and the one or more photoactive layers.

Example 20 is the organic photovoltaic device of example(s) 12-19, wherein the organic photovoltaic device is visibly transparent.

Example 21 is the organic photovoltaic device of example(s) 12-20, wherein the charge transport layer has distinct spectral absorption properties from the one or more photoactive layers.

Example 22 is an organic photovoltaic device comprising: a substrate; a first electrode coupled to the substrate; a second electrode disposed above the first electrode; one or more photoactive layers disposed between the first electrode and the second electrode; and a compound charge transport layer disposed between the second electrode and the one or more photoactive layers, wherein the compound charge transport layer includes: a charge transport layer; and a metal-oxide interlayer coupled to the charge transport layer and disposed between the charge transport layer and the one or more photoactive layers.

Example 23 is the organic photovoltaic device of example(s) 22, further comprising: a second compound charge transport layer coupled to the compound charge transport layer, wherein the second compound charge transport layer includes: a second charge transport layer; and a second metal-oxide interlayer coupled to the second charge transport layer and disposed between the second charge transport layer and the one or more photoactive layers.

Example 24 is the organic photovoltaic device of example(s) 22, wherein the first electrode is an anode, the second electrode is a cathode, and the charge transport layer is an electron transport layer.

Example 25 is the organic photovoltaic device of example(s) 24, further comprising: a metal-oxide electron-injection layer disposed between the second electrode and the electron transport layer.

Example 26 is the organic photovoltaic device of example(s) 22, wherein the first electrode is a cathode, the second electrode is an anode, and the charge transport layer is a hole transport layer.

Example 27 is the organic photovoltaic device of example(s) 26, further comprising: a metal-oxide hole-injection layer disposed between the second electrode and the hole transport layer.

Example 28 is the organic photovoltaic device of example(s) 22-27, wherein the one or more photoactive layers includes a bulk heterojunction photoactive layer comprising a blend of an electron donor material and an electron acceptor material.

Example 29 is the organic photovoltaic device of example(s) 22-28, further comprising: a p-phenylene layer disposed between the metal-oxide interlayer and the one or more photoactive layers.

Example 30 is the organic photovoltaic device of example(s) 22, wherein the organic photovoltaic device is visibly transparent.

Example 31 is the organic photovoltaic device of example(s) 22, wherein the charge transport layer has distinct spectral absorption properties from the one or more photoactive layers.

Example 32 is an organic photovoltaic device comprising: a substrate; a first electrode coupled to the substrate; a second electrode disposed above the first electrode; one or more photoactive layers disposed between the first electrode and the second electrode; a first compound charge transport layer disposed between the first electrode and the one or more photoactive layers; and a second compound charge transport layer disposed between the second electrode and the one or more photoactive layers, wherein each compound charge transport layer includes: a charge transport layer; and a metal-oxide interlayer coupled to the charge transport layer and disposed between the charge transport layer and the one or more photoactive layers.

Example 33 is the organic photovoltaic device of example(s) 32, wherein the first electrode is an anode, the second electrode is a cathode, the first charge transport layer is a hole transport layer, and the second charge transport layer is an electron transport layer.

Example 34 is the organic photovoltaic device of example(s) 33, further comprising: a metal-oxide hole-injection layer disposed between the first electrode and the hole transport layer.

Example 35 is the organic photovoltaic device of example(s) 33, further comprising: a metal-oxide electron-injection layer disposed between the second electrode and the electron transport layer.

Example 36 is the organic photovoltaic device of example(s) 34, further comprising: a metal-oxide electron-injection layer disposed between the second electrode and the electron transport layer.

Example 37 is the organic photovoltaic device of example(s) 32, wherein the first electrode is an cathode, the second electrode is an anode, the first charge transport layer is an electron transport layer, and the second charge transport layer is a hole transport layer.

Example 38 is the organic photovoltaic device of example(s) 37, further comprising: a metal-oxide electron-injection layer disposed between the first electrode and the electron transport layer.

Example 39 is the organic photovoltaic device of example(s) 37, further comprising: a metal-oxide hole-injection layer disposed between the second electrode and the hole transport layer.

Example 40 is the organic photovoltaic device of example(s) 38, further comprising: a metal-oxide hole-injection layer disposed between the second electrode and the hole transport layer.

Example 41 is the organic photovoltaic device of example(s) 32-40, wherein the one or more photoactive layers includes a bulk heterojunction photoactive layer comprising a blend of an electron donor material and an electron acceptor material.

Example 42 is the organic photovoltaic device of example(s) 32-41, further comprising: a p-phenylene layer disposed between the metal-oxide interlayer of the first compound charge transport layer and the one or more photoactive layers.

Example 43 is the organic photovoltaic device of example(s) 32-41, further comprising: a p-phenylene layer disposed between the metal-oxide interlayer of the second compound charge transport layer and the one or more photoactive layers.

Example 44 is the organic photovoltaic device of example(s) 32-41, further comprising: a first p-phenylene layer disposed between the metal-oxide interlayer of the second compound charge transport layer and the one or more photoactive layers.

Example 45 is the organic photovoltaic device of example(s) 32-44, wherein the organic photovoltaic device is visibly transparent.

Example 46 is the organic photovoltaic device of example(s) 32-45, wherein the charge transport layers have distinct spectral absorption properties from the one or more photoactive layers.

Example 47 is a method of making an organic photovoltaic device, the method comprising: providing a substrate; forming a first electrode over the substrate; forming a second electrode over the first electrode; forming one or more photoactive layers between the first electrode and the second electrode; and forming a compound charge transport layer between the one or more photoactive layers and either the first electrode or the second electrode, wherein the compound charge transport layer includes: a charge transport layer; and a metal-oxide interlayer coupled to the charge transport layer and disposed between the charge transport layer and the one or more photoactive layers.

Example 48 is the method of example(s) 47, further comprising: forming a second compound charge transport layer coupled to the compound charge transport layer, wherein the second compound charge transport layer includes: a second charge transport layer; and a second metal-oxide interlayer coupled to the second charge transport layer and disposed between the second charge transport layer and the one or more photoactive layers.

Example 49 is the method of example(s) 47, wherein the first electrode is an anode and the second electrode is a cathode.

Example 50 is the method of example(s) 47, wherein the charge transport layer is a hole transport layer.

Example 51 is the method of example(s) 47, further comprising: forming a metal-oxide charge-injection layer between the first electrode and the compound charge transport layer.

Example 52 is the method of example(s) 47, wherein the charge transport layer is an electron transport layer.

Example 53 is the method of example(s) 47, further comprising: forming a metal-oxide charge-injection layer between the compound charge transport layer and the second electrode.

Example 54 is the method of example(s) 47-53, wherein the one or more photoactive layers includes a bulk heterojunction photoactive layer comprising a blend of an electron donor material and an electron acceptor material.

Example 55 is the method of example(s) 47-54, wherein the organic photovoltaic device is visibly transparent.

Example 56 is the method of example(s) 47-55, wherein the charge transport layer has distinct spectral absorption properties from the one or more photoactive layers.

Numerous benefits are achieved by way of the present invention over conventional techniques. For example, embodiments of the present disclosure enable the barrier-free coupling of dissimilar organic materials in the case of multilayers, which would normally be limited in their pairing by HOMO or LUMO level offsets. Additionally, the sandwiching of the organic layers between metal oxides decouples their energy levels from the built-in potential of the photovoltaic cell, such that their HOMO or LUMO levels do not limit the open-circuit voltage. According to embodiments of the present invention, the compound charge transport layer can provide a low-resistance and charge-selective (preferential to either holes or electrons) contact to the photovoltaic active layers.

Different benefits can be achieved by varying the implementation of the "compound" charge transport layer. The compound charge transport layers may be included as a single structure or may be repeated as multilayers in a stack. The metal oxide material may be varied between layers or kept consistent, and the organic layers may be kept consistent or varied in the case of multilayers. The individual organic layers and metal oxides may themselves be multilayers (e.g. two or more layers of different organics or metal oxides, respectively). Optionally, the organic layer(s) may be extrinsically doped to further reduce electrical resistance.

These and other embodiments and aspects of the invention along with many of its advantages and features are described in more detail in conjunction with the text below and attached figures.

DETAILED DESCRIPTION OF SPECIFIC EMBODIMENTS

Figure 1:
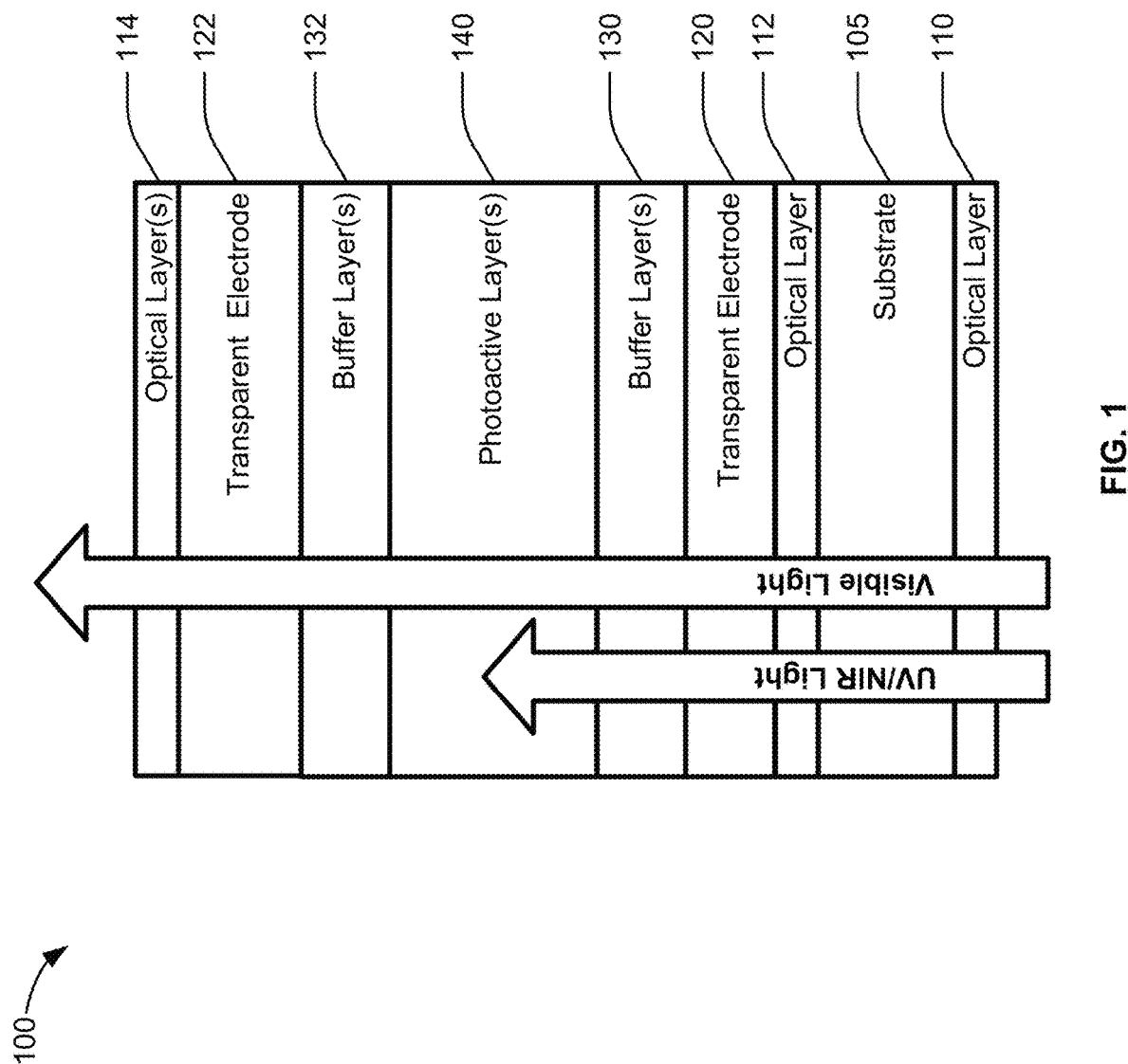
FIG. 1 illustrates a simplified schematic diagram of a visibly transparent photovoltaic device according to an embodiment of the present invention.

Charge transport layers in organic photovoltaics (OPVs) can provide a variety of benefits to device performance. Sufficiently wide-bandgap layers can block excitons in the active layers from reaching the electrodes (where parasitic exciton recombination occurs) and additionally serve to inhibit metal penetration into the active layers when applied below an evaporated top metal contact. Charge transport layers may be included to improve charge selectivity (preferential hole or electron transport) to the contacts. In opaque cells with a thick metal electrode, or in the case of devices exhibiting strong optical interference effects, transport layers may be used to tune the optical cavity to tailor absorption in the active layers at specific wavelengths. This approach has been used to produce spectrally narrow organic photodetectors (OPDs) and is commonly used in OPVs to maximize absorption and photocurrent more broadly.

For transparent OPVs, charge transport layers may be used with structured absorption in the ultraviolet (UV), visible, or near-infrared (NIR) wavelengths to tailor the transmitted and reflected spectra from the device. While usually not contributing to photocurrent, these layers can be used as complimentary absorbers to the active layer materials such that a neutral (or desired) color is produced. When used as NIR absorbers, these layers may reduce the transmitted solar irradiance through the transparent OPV, thus reducing the overall solar heat gain and improving thermal efficiency for applications such as architectural glass.

Conventional approaches to charge transport layers typically require sufficient alignment of energy levels between neighboring organic layers to avoid injection/extraction barriers and the buildup of charge carriers. In the case of organic hole transport layers (HTLs), the highest occupied molecular orbital (HOMO) is typically aligned to the HOMO of the donor(s) in the neighboring device active layers. Conversely, in the case of electron transport layers (ETLs), the lowest unoccupied molecular orbital (LUMO) level is sufficiently aligned to the LUMO of the acceptor(s) in the neighboring device active layers. In some instances, charge transport layers with the opposite polarity may be used—for example, a material such as $Ru(acac)_3$ with a shallow HOMO level aligned to the LUMO of the acceptor(s) in the active layer may be used as a hole-conducting (instead of electron-conducting) transport layer to the cathode. Similarly, materials such as HAT-CN with a deep LUMO level aligned to the HOMO of the donor(s) in the active layer may be used as an electron-conducting (as opposed to hole-conducting) transport layer to the anode.

One modification to the above approaches for HTLs and ETLs is to use dopants to increase the organic transport layer's conductivity and tune the work function such that any energy level misalignment effects are reduced or minimized. This approach may be characterized by several limitations. First, energy level alignment may still be an issue in the case of significantly mismatched HOMO or LUMO levels between the doped transport layer and the active layer. Second, the doping efficiency of most dopants is usually quite low. For example, in the case of small molecule organic dopants less than 10% of dopant molecules may contribute charge. Third, most dopants are not universal to all organic host molecules, so modifications to the transport layers may require new dopants to be effective. Fourth, doping organic layers typically introduces new absorption features due to cationic or anionic radicals in both the charged dopant species and the high density of charges introduced to the host molecules. This can impact color tuning in the case of transparent OPVs or introduce absorption bands overlapping the active layers' absorption, parasitically dissipating some of the incident light in the doped layers. Finally doped transport layers are typically less stable than undoped layers due to the fact that charged species are highly reactive to both oxygen and moisture and can undergo chemical reactions.

In many cases, charge transport layers are connected to the electrode by a charge injection layer. In the case of an HTL or ETL this charge injection layer would commonly be referred to as a hole-injection layer (HIL) or electron-injection layer (EIL), respectively. Often HILs and EILs are composed of conductive metal oxides such as $MoO_3$, $WoO_3$, or NiO, or polymers such as PEDOT:PSS or PEIE. In all cases, these layers provide an ohmic contact to the transport layers for efficient charge injection and extraction. For the purposes of this disclosure, the HIL or EIL are considered to be part of the anode or cathode, respectively.

In the present disclosure, the concept of a "compound" charge transport layer is introduced which may comprise an HTL or ETL sandwiched between the electrode (anode or cathode, respectively) and a conductive metal oxide. Often on the electrode side, a conductive metal oxide acts as a traditional charge injection layer (e.g. HIL). However on the active layer side of the compound HTL (or ETL), the conductive metal oxide interlayer provides ohmic contact between the organic charge transport layer and the active layer. This essentially decouples the energy levels of the transport layer and the active layer, fully removing the requirement of energy level alignment. The sandwiching of the organic transport layers has the additional benefit of providing some interfacial doping at the organic/oxide interfaces, which helps to improve conductivity without the use and associated complications of extrinsic doping. In the embodiments presented, HTLs comprised of small organic molecules are demonstrated with HOMO levels spanning ~2 eV that all exhibit comparable high performance.

Multiple combinations of organic transport layers (such as multiple organic HTLs) are also demonstrated in the same device using multilayers, whereby distinct HTLs are connected through thin metal oxide layers and the entire compound HTL stack is sandwiched between metal oxide layers. In this way, multiple absorbers or transport layers with varying refractive index may be incorporated to tailor the color or spectral response of an OPV (or OPD) without impacting device performance.

While the compound charge transport layer does not require extrinsic doping of the organics to perform well, these approaches are not mutually exclusive. Doped organic layers may also be used as the transport layers, which may further improve conductivity and provide additional degrees of freedom for device engineering. Multiple HTLs are demonstrated to function within the compound HTL structure as both intrinsic (undoped) layers as well as extrinsically doped layers when blended with a dopant such as a metal oxide. This highlights the versatility of the compound HTL approach—materials that would typically be incompatible with the paired active layers (giving low or near-zero efficiency) are shown to work within a compound HTL structure regardless of doping. For this reason, the transport layer within a compound HTL or ETL may comprise single or blended organics, organic/inorganic blends, or combinations thereof.

Although many examples of the present disclosure focus on HTLs, this concept may also be extended to ETLs, provided an oxide is used with sufficient ohmic contact to the neighboring organic layers.

For transparent OPVs, charge transport layers may be used with structured absorption in the ultraviolet (UV), visible, or near-infrared (NIR) wavelengths to tailor the transmitted and reflected spectra of the device. While usually not contributing to photocurrent, these layers can be used as complimentary absorbers to the active layer materials such that a neutral (or desired) color is produced. When used as NIR absorbers, these layers may reduce the transmitted solar irradiance through the transparent OPV, thus reducing the overall solar heat gain and improving thermal efficiency for applications such as architectural glass. In the embodiments presented, both visibly transparent and visibly absorbing HTL materials are utilized in compound HTLs. In the case of UV-absorbing, visibly transparent transport layers, the reflected color is demonstrated to be adjusted with HTL thickness independent of the transmitted color and performance. Similarly, visibly absorbing HTLs with complementary absorption to the active layer are demonstrated to neutralize transmitted color while simultaneously adjusting the reflected color. Combinations of both approaches are also presented, whereby a visibly transparent HTL is paired with a visibly absorbing HTL within a multilayer compound HTL. This combines the advantages of both approaches—enabling the tuning of transmitted and reflected color independently of one another. Some of the examples of visibly absorbing HTLs demonstrated here exhibit NIR absorption, which may additionally reduce the SHGC of the transparent OPVs.

Accordingly, in various embodiments, the charge transport layer may have distinct spectral absorption from the photoactive layers. As one example, the photoactive layers may have tail absorption in blue and red while the charge transport layer has peak absorption in the visible, complementary to active layers (e.g. in the green), the resulting effect being a neutralized transmitted color. As another example, the photoactive layer may have a narrow peak absorption in a portion of the near infrared while the charge transport layer has broad absorption in the NIR, complementary to active layer, the resulting effect being a decreased SHGC while retaining high AVT. As another example, the photoactive layers may have any type of absorption while the charge transport layer has minimal absorption across the spectrum, the resulting effect being a reflected color that is modulated.

FIG. 1 illustrates a simplified schematic diagram of a visibly transparent photovoltaic device 100, according to an embodiment of the present invention. As illustrated in FIG. 1, visibly transparent photovoltaic device 100 includes a number of layers and elements discussed more fully below. As discussed herein, visibly transparent indicates that the photovoltaic device absorbs optical energy at wavelengths outside the visible wavelength band of 450 nm to 650 nm, for example, while substantially transmitting visible light inside the visible wavelength band. As illustrated in FIG. 1, UV and/or NIR light is absorbed in the layers and elements of the photovoltaic device while visible light is transmitted through the device. Thus, the discussion of transparency provided herein should be understood as visible transparency.

Substrate 105, which can be glass or other visibly transparent materials providing sufficient mechanical support to the other layers and structures illustrated, supports optical layers 110 and 112. These optical layers can provide a variety of optical properties, including antireflection (AR) properties, wavelength selective reflection or distributed Bragg reflection properties, index matching properties, encapsulation, or the like. Optical layers may advantageously be visibly transparent. An additional optical layer 114 can be utilized, for example, as an AR coating, an index matching layer, a passive infrared or ultraviolet absorption layer, etc. Optionally, optical layers may be transparent to ultraviolet and/or near-infrared light or transparent to at least a subset of wavelengths in the ultraviolet and/or near-infrared bands. Depending on the configuration, additional optical layer 114 may also be a passive visible absorption layer. Example substrate materials include various glasses and rigid or flexible polymers. Multilayer substrates such as laminates and the like may also be utilized. Substrates may have any suitable thickness to provide the mechanical support needed for the other layers and structures, such as, for example, thicknesses from 1 mm to 20 mm. In some cases, the substrate may be or comprise an adhesive film to allow application of the visibly transparent photovoltaic device 100 to another structure, such as a window pane, display device, etc.

It will be appreciated that, although the devices overall may exhibit visible transparency, such as a transparency in the 450-650 nm range greater than 30%, greater than 40%, greater than 50%, greater than 60%, greater than 70%, or up to or approaching 100%, certain materials taken individually may exhibit absorption in portions of the visible spectrum. Optionally, each individual material or layer in a visibly transparent photovoltaic device has a high transparency in the visible range, such as greater than 30% (i.e., between 30% and 100%). It will be appreciated that transmission or absorption may be expressed as a percentage and may be dependent on the material's absorbance properties, a thickness or path length through an absorbing material, and a concentration of the absorbing material, such that a material with an absorbance in the visible spectral region may still exhibit a low absorption or high transmission if the path length through the absorbing material is short and/or the absorbing material is present in low concentration.

As described herein and below, photoactive materials in various photoactive layers advantageously exhibit minimal absorption in the visible region (e.g., less than 20%, less than 30%, less than 40%, less than 50%, less than 60%, or less than 70%), and instead exhibit high absorption in the near-infrared and/or ultraviolet regions (e.g., an absorption peak of greater than 50%, greater than 60%, greater than 70%, or greater than 80%). For some applications, absorption in the visible region may be as large as 70%. Various configurations of other materials, such as the substrate, optical layers, and buffer layers, may allow these materials to provide overall visible transparency, even though the materials may exhibit some amount of visible absorption. For example, a thin film of a metal may be included in a transparent electrode, such as a metal that exhibits visible absorption, like Ag or Cu; when provided in a thin film configuration, however, the overall transparency of the film may be high. Similarly, materials included in an optical or buffer layer may exhibit absorption in the visible range but may be provided at a concentration or thickness where the overall amount of visible light absorption is low, providing visible transparency.

The visibly transparent photovoltaic device 100 also includes a set of transparent electrodes 120 and 122 with a photoactive layer 140 positioned between electrodes 120 and 122. These electrodes, which can be fabricated using ITO, thin metal films, or other suitable visibly transparent materials, provide electrical connection to one or more of the various layers illustrated. For example, thin films of copper, silver, or other metals may be suitable for use as a visibly transparent electrode, even though these metals may absorb light in the visible band. When provided as a thin film, however, such as a film having a thickness of 1 nm to 200 nm (e.g., about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 105 nm, about 110 nm, about 115 nm, about 120 nm, about 125 nm, about 130 nm, about 135 nm, about 140 nm, about 145 nm, about 150 nm, about 155 nm, about 160 nm, about 165 nm, about 170 nm, about 175 nm, about 180 nm, about 185 nm, about 190 nm, or about 195 nm), an overall transmittance of the thin film in the visible band may remain high, such as greater than 30%, greater than 40%, greater than 50%, greater than 60%, greater than 70%, greater than 80%, or greater than 90%. Advantageously, thin metal films, when used as transparent electrodes, may exhibit lower absorption in the ultraviolet band than other semiconducting materials that may be useful as a transparent electrode, such as ITO, as some semiconducting transparent conducting oxides exhibit a band gap that occurs in the ultraviolet band and thus are highly absorbing or opaque to ultraviolet light. In some cases, however, an ultraviolet absorbing transparent electrode may be used, such as to screen at least a portion of the ultraviolet light from underlying components, as ultraviolet light may degrade certain materials.

A variety of deposition techniques may be used to generate a transparent electrode, including vacuum deposition techniques, such as atomic layer deposition, chemical vapor deposition, physical vapor deposition, thermal evaporation, sputter deposition, epitaxy, etc. Solution based deposition techniques, such as spin-coating, slot-die coating, blade coating, spray coating etc. may also be used in some cases. In addition, transparent electrodes may be patterned using techniques known in the art of microfabrication, including lithography, lift off, etching, etc.

Buffer layers 130 and 132 and photoactive layer 140 are utilized to implement the electrical and optical properties of the photovoltaic device. These layers can be layers of a single material or can include multiple sub-layers as appropriate to the particular application. Thus, the term "layer" is not intended to denote a single layer of a single material but can include multiple sub-layers of the same or different materials. In some embodiments, buffer layer 130, photoactive layer(s) 140 and buffer layer 132 are repeated in a stacked configuration to provide tandem device configurations, such as including multiple heterojunctions. In some embodiments, the photoactive layer(s) include electron donor materials and electron acceptor materials, also referred to as donors and acceptors. These donors and acceptors are visibly transparent but absorb outside the visible wavelength band to provide the photoactive properties of the device.

Useful buffer layers include those that function as electron transport layers, electron blocking layers, hole transport layers, hole blocking layers, exciton blocking layers, optical spacers, physical buffer layers, charge recombination layers, or charge generation layers. Buffer layers may exhibit any suitable thickness to provide the buffering effect desired and may optionally be present or absent. Useful buffer layers, when present, may have thicknesses from 1 nm to 1 µm. Various materials may be used as buffer layers, including fullerene materials, carbon nanotube materials, graphene materials, metal oxides, such as molybdenum oxide, titanium oxide, zinc oxide, etc., polymers, such as poly(3,4-ethylenedioxythiophene), polystyrene sulfonic acid, polyaniline, etc., copolymers, polymer mixtures, and small molecules, such as bathocuproine. Buffer layers may be applied using a deposition process (e.g., thermal evaporation or sputtering) or a solution processing method (e.g., spin coating).

Examples of materials that can be utilized as active/buffer (transport layers)/optical materials in various embodiments of the present invention include near-IR absorbing materials, UV absorbing materials, and/or materials that are characterized by strong absorption peaks in the near-IR or UV regions of the electromagnetic spectrum. Near-IR absorbing materials include phthalocyanines, porphyrins, naphthalocyanines, squaraines, boron-dipyrromethenes, naphthalenes, rylenes, perylenes, tetracyano quinoidal thiophene compounds, tetracyano indacene compounds, carbazole thiaporphyrin compounds, metal dithiolates, benzothiadiazole containing compounds, dicyanomethylene indanone containing compounds, combinations thereof, and the like. UV absorbing materials include fullerenes, rylenes, perylenes, benzimidazoles, hexacarbonitriles, triarylamines, bistriarylamines, phenanthrolines, para-phenylenes, combinations thereof, and the like.

Figure 2A:
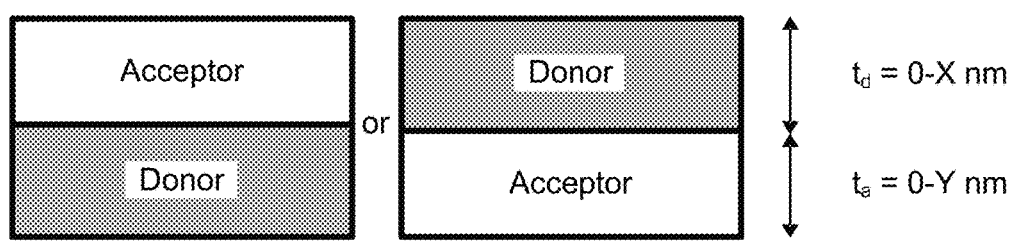
FIGS. 2A-2E illustrate various example junction configurations for a photoactive layer.
Figure 2B:
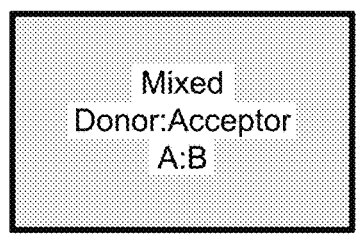
Figure 2C:
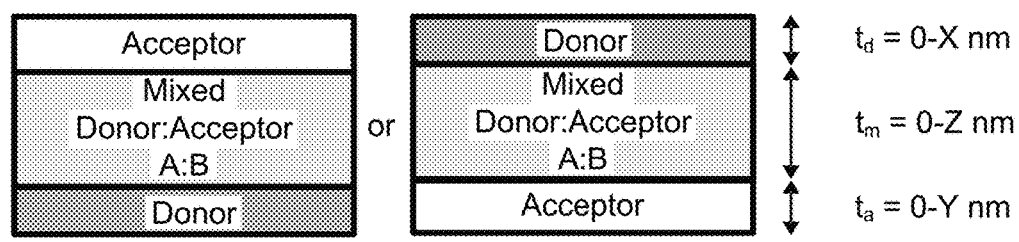
Figure 2D:
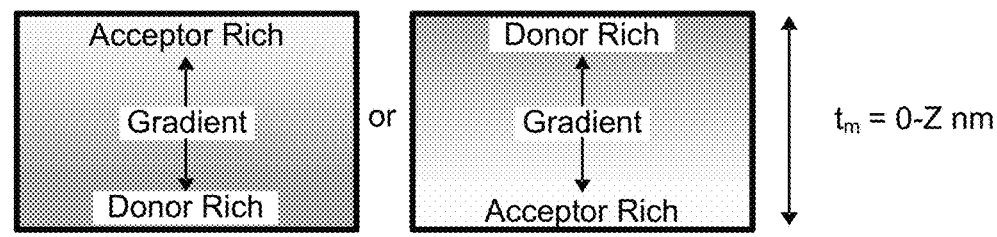
Figure 2E:
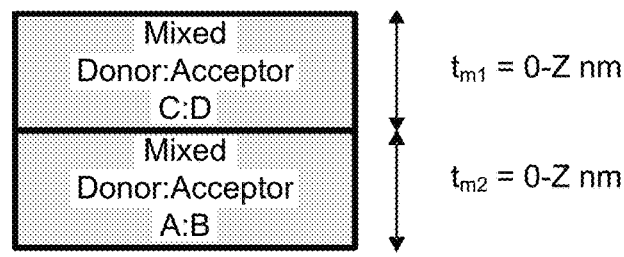

FIGS. 2A-2E illustrate various example junction configurations for photoactive layer 140. Photoactive layer 140 may optionally correspond to planar donor/acceptor configurations (as shown in FIG. 2A), mixed donor/acceptor (bulk heterojunction) configurations (as shown in FIG. 2B), planar and mixed donor/acceptor configurations (as shown in FIG. 2C), gradient donor/acceptor configurations (as shown in FIG. 2D), or stacked heterojunction configurations (as shown in FIG. 2E).

Various materials may optionally be used as the photoactive layers 140, such as materials that absorb in the ultraviolet band or the near-infrared band but that only absorb minimally, if at all, in the visible band. In this way, the photoactive material may be used to generate electron-hole pairs for powering an external circuit by way of ultraviolet and/or near-infrared absorption, leaving the visible light relatively unperturbed to provide visible transparency. As illustrated, photoactive layer 140 may comprise a planar heterojunction including separate donor and acceptor layers. Photoactive layer 140 may alternatively comprise a planar-mixed heterojunction structure including separate acceptor and donor layers and a mixed donor-acceptor layer. Photoactive layer 140 may alternatively comprise a mixed heterojunction structure including a fully mixed acceptor-donor layer or those including a mixed donor-acceptor layer with various relative concentration gradients.

Photoactive layers may have any suitable thickness and may have any suitable concentration or composition of photoactive materials to provide a desired level of transparency and ultraviolet/near-infrared absorption characteristics. Example thicknesses of a photoactive layer may range from about 1 nm to about 1 µm, about 1 nm to about 300 nm, or about 1 nm to about 100 nm. In some cases, photoactive layers may be made up of individual sub-layers or mixtures of layers to provide suitable photovoltaic power generation characteristics, as illustrated in FIGS. 2A-2E. The various configurations depicted in FIGS. 2A-2E may be used and dependent on the particular donor and acceptor materials used in order to provide advantageous photovoltaic power generation. For example, some donor and acceptor combinations may benefit from particular configurations, while other donor and acceptor combinations may benefit from other particular configurations. Donor materials and acceptor materials may be provided in any ratio or concentration to provide suitable photovoltaic power generation characteristics. For mixed layers, the relative concentration of donors to acceptors is optionally between about 20 to 1 and about 1 to 20. Optionally, the relative concentration of donors to acceptors is optionally between about 5 to 1 and about 1 to 5. Optionally, donors and acceptors are present in a 1 to 1 ratio.

Various visibly transparent photoactive compounds are useful as an electron donor photoactive material and, in some embodiments, may be paired with suitable electron acceptor photoactive materials in order to provide a useful photoactive layer in the photovoltaic device. Various visibly transparent photoactive compounds are useful as an electron acceptor photoactive material and may be paired with suitable electron donor photoactive materials in order to provide a useful photoactive layer in the photovoltaic device. Example donor and acceptor materials are described in U.S. Provisional Application Nos. 62/521,154, 62/521,158, 62/521,160, 62/521,211, 62/521,214, and 62/521,224, each filed on Jun. 16, 2017, which are hereby incorporated by reference in their entireties.

In some embodiments, the chemical structure of various photoactive compounds can be functionalized with one or more directing groups, such as electron donating groups, electron withdrawing groups, or substitutions about or to a core metal atom, in order to provide desirable electrical characteristics to the material. For example, in some embodiments, the photoactive compounds are functionalized with amine groups, phenol groups, alkyl groups, phenyl groups, or other electron donating groups to improve the ability of the material to function as an electron donor in a photovoltaic device. As another example, in some embodiments, the photoactive compounds are functionalized with cyano groups, halogens, sulfonyl groups, or other electron withdrawing groups to improve the ability of the material to function as an electron acceptor in a photovoltaic device.

In embodiments, the photoactive compounds are functionalized to provide desirable optical characteristics. For example, in some embodiments, the photoactive compounds may be functionalized with an extended conjugation to redshift the absorption profile of the material. It will be appreciated that conjugation may refer to a delocalization of pi electrons in a molecule and may be characterized by alternating single and multiple bonds in a molecular structure. For example, functionalizations that extend the electron conjugation may include fusing one or more aromatic groups to the molecular structure of the material. Other functionalizations that may provide extended conjugation include alkene functionalization, such as by a vinyl group, aromatic or heteroaromatic functionalization, carbonyl functionalization, such as by an acyl group, sulfonyl functionalization, nitro functionalization, cyano functionalization, etc. It will be appreciated that various molecular functionalizations may impact both the optical and the electrical properties of the photoactive compounds.

It will be appreciated that device function may be impacted by the morphology of the active layers in the solid state. Separation of electron donors and acceptors into discrete domains, with dimensions on the scale of the exciton diffusion length and large interfacial areas, can be advantageous for achieving high device efficiency. Advantageously, the molecular framework of the photoactive materials can be tailored to control the morphology of the materials. For example, the introduction of functional groups as described herein can have large impacts to the morphology of the material in the solid state, regardless of whether such modifications impact the energetics or electronic properties of the material. Such morphological variations can be observed in pure materials and when a particular material is blended with a corresponding donor or acceptor. Useful functionalities to control morphology include, but are not limited to, addition of alkyl chains, conjugated linkers, fluorinated alkanes, bulky groups (e.g., tert-butyl, phenyl, naphthyl or cyclohexyl), as well as more complex coupling procedures designed to force parts of the structure out of the plane of the molecule to inhibit excessive crystallization.

In embodiments, other molecular structural characteristics may provide desirable electrical and optical properties in the photoactive compounds. For example, in some embodiments, the photoactive compounds may exhibit portions of the molecule that may be characterized as electron donating while other portions of the molecule may be characterized as electron accepting. Without wishing to be bound by any theory, molecules including alternating electron donating and electron accepting portions may result in redshifting the absorption characteristics of the molecule as compared to similar molecules lacking alternating electron donating and electron accepting portions. For example, alternating electron donating and electron accepting portions may decrease or otherwise result in a lower energy gap between a highest occupied molecular orbital and a lowest unoccupied molecular orbital. Organic donor and/or acceptor groups may be useful as R-group substituents, such as on any aryl, aromatic, heteroaryl, heteroaromatic, alkyl, or alkenyl group, in the visibly transparent photoactive compounds.

When the donor/acceptor materials are incorporated as a photoactive layer in a transparent photovoltaic device as either an electron donor or electron acceptor, the layer thicknesses can be controlled to vary device output, absorbance, or transmittance. For example, increasing the donor or acceptor layer thickness can increase the light absorption in that layer. In some cases, increasing a concentration of donor/acceptor materials in a donor or acceptor layer may similarly increase the light absorption in that layer. However, in some embodiments, a concentration of donor/acceptor materials may not be adjustable, such as when active material layers comprise pure or substantially pure layers of donor/acceptor materials or pure or substantially pure mixtures of donor/acceptor materials. Optionally, donor/acceptor materials may be provided in a solvent or suspended in a carrier, such as a buffer layer material, in which case the concentration of donor/acceptor materials may be adjusted. In some embodiments, the donor layer concentration is selected where the current produced is maximized. In some embodiments, the acceptor layer concentration is selected where the current produced is maximized.

However, the charge collection efficiency can decrease with increasing donor or acceptor thickness due to the increased "travel distance" for the charge carriers. Therefore, there may be a trade-off between increased absorption and decreasing charge collection efficiency with increasing layer thickness. It can thus be advantageous to select materials that have a high absorption coefficient and/or concentration to allow for increased light absorption per thickness.

In some embodiments, the donor layer thickness is selected where the current produced is maximized. In some embodiments, the acceptor layer thickness is selected where the current produced is maximized.

In addition to the individual photoactive layer thicknesses, the thickness and composition of the other layers in the transparent photovoltaic device can also be selected to enhance absorption within the photoactive layers. The other layers (buffer layers, electrodes, etc.), are typically selected based on their optical properties (index of refraction and extinction coefficient) in the context of the thin film device stack and resulting optical cavity. For example, a near-infrared absorbing photoactive layer can be positioned in the peak of the optical field for the near-infrared wavelengths where it absorbs to maximize absorption and resulting current produced by the device. This can be accomplished by spacing the photoactive layer at an appropriate distance from the electrode using a second photoactive layer and/or optical layers as spacer. A similar scheme can be used for ultraviolet absorbing photoactive layers. In many cases, the peaks of the longer wavelength optical fields will be positioned further from the more reflective of the two transparent electrodes compared to the peaks of the shorter wavelength optical fields. Thus, when using separate donor and acceptor photoactive layers, the donor and acceptor can be selected to position the more red-absorbing (longer wavelength) material further from the more reflective electrode and the more blue absorbing (shorter wavelength) closer to the more reflective electrode.

In some embodiments, optical layers may be included to increase the intensity of the optical field at wavelengths where the donor absorbs in the donor layer to increase light absorption and hence, increase the current produced by the donor layer. In some embodiments, optical layers may be included to increase the intensity of the optical field at wavelengths where the acceptor absorbs in the acceptor layer to increase light absorption and hence, increase the current produced by the acceptor layer. In some embodiments, optical layers may be used to improve the transparency of the stack by either decreasing visible absorption or visible reflection. Further, the electrode material and thickness may be selected to enhance absorption outside the visible range within the photoactive layers, while preferentially transmitting light within the visible range.

Optionally, enhancing spectral coverage of a visibly transparent photovoltaic device is achieved by the use of a multi-cell series stack of visibly transparent photovoltaic devices, referred to as tandem cells, which may be included as multiple stacked instances of buffer layer 130, photoactive layer 140, and buffer layer 132, as described with reference to FIG. 1. This architecture includes more than one photoactive layer, which are typically separated by a combination of buffer layer(s) and/or thin metal layers, for example. In this architecture, the currents generated in each subcell flow in series to the opposing electrodes and therefore, the net current in the cell is limited by the smallest current generated by a particular subcell, for example. The open circuit voltage ($V_{OC}$) is equal to the sum of the $V_{OC}$ values of the subcells. By combining sub-cells fabricated with different donor-acceptors pairs which absorb in different regions of the solar spectrum, a significant improvement in efficiency relative to a single junction cell can be achieved.

Figure 3:
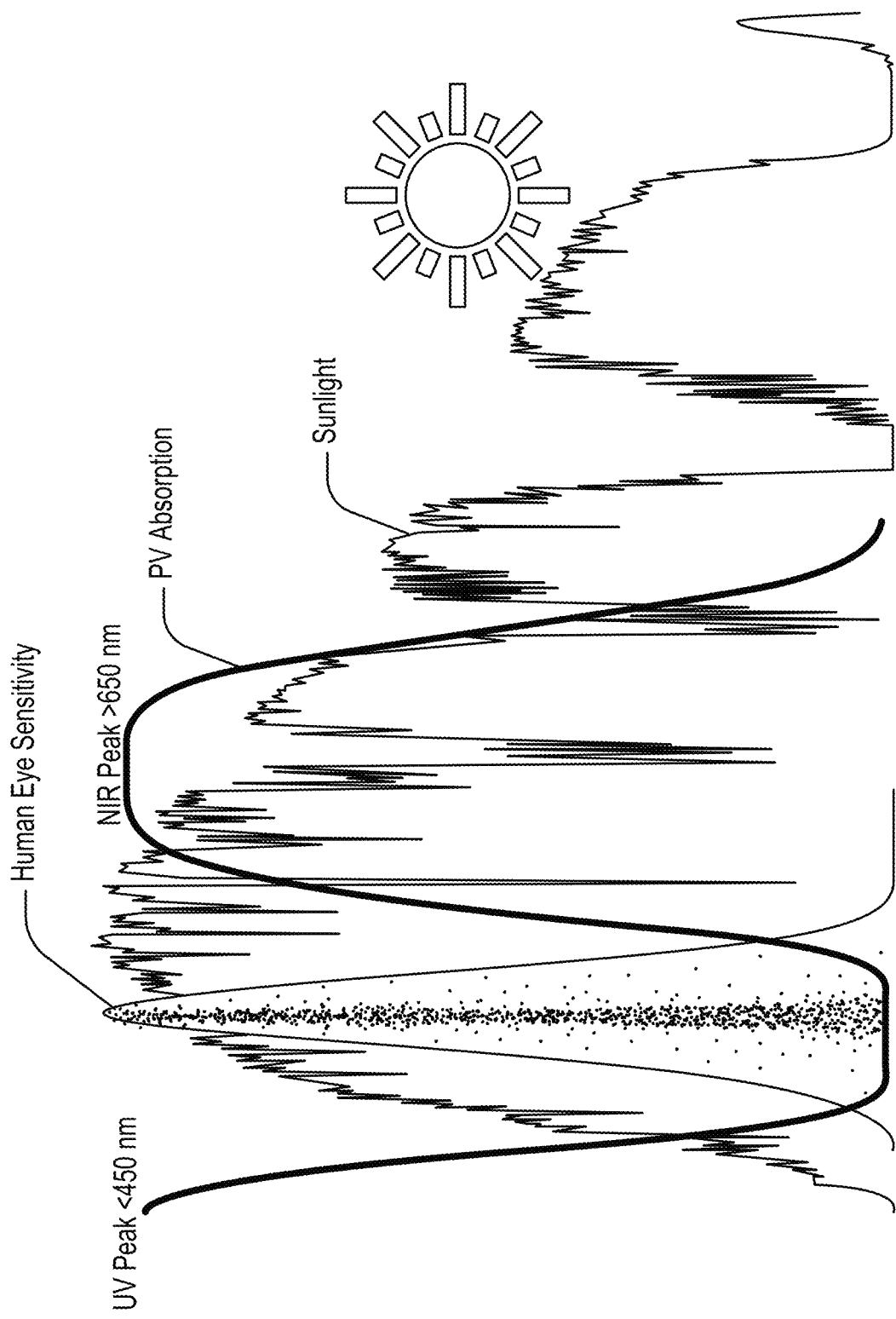
FIG. 3 illustrates a simplified plot of the solar spectrum, human eye sensitivity, and exemplary visibly transparent photovoltaic device absorption as a function of wavelength.

FIG. 3 illustrates a simplified plot of the solar spectrum, human eye sensitivity, and exemplary visibly transparent photovoltaic device absorption as a function of wavelength. As illustrated in FIG. 3, embodiments of the present invention utilize photovoltaic structures that have low absorption in the visible wavelength band between about 450 nm and about 650 nm, but absorb in the UV and NIR bands, i.e., outside the visible wavelength band, enabling visibly transparent photovoltaic operation. The ultraviolet band or ultraviolet region may be described, in embodiments, as wavelengths of light of between about 200 nm and 450 nm. It will be appreciated that useful solar radiation at ground level may have limited amounts of ultraviolet less than about 280 nm and, thus, the ultraviolet band or ultraviolet region may be described as wavelengths of light of between about 280 nm and 450 nm, in some embodiments. The near-infrared band or near-infrared region may be described, in embodiments, as wavelengths of light of between about 650 nm and 1400 nm. Various compositions described herein may exhibit absorption including a UV peak and/or a NIR peak with a maximum absorption strength in the visible region that is smaller than that in the NIR region or UV region.

Figure 4:
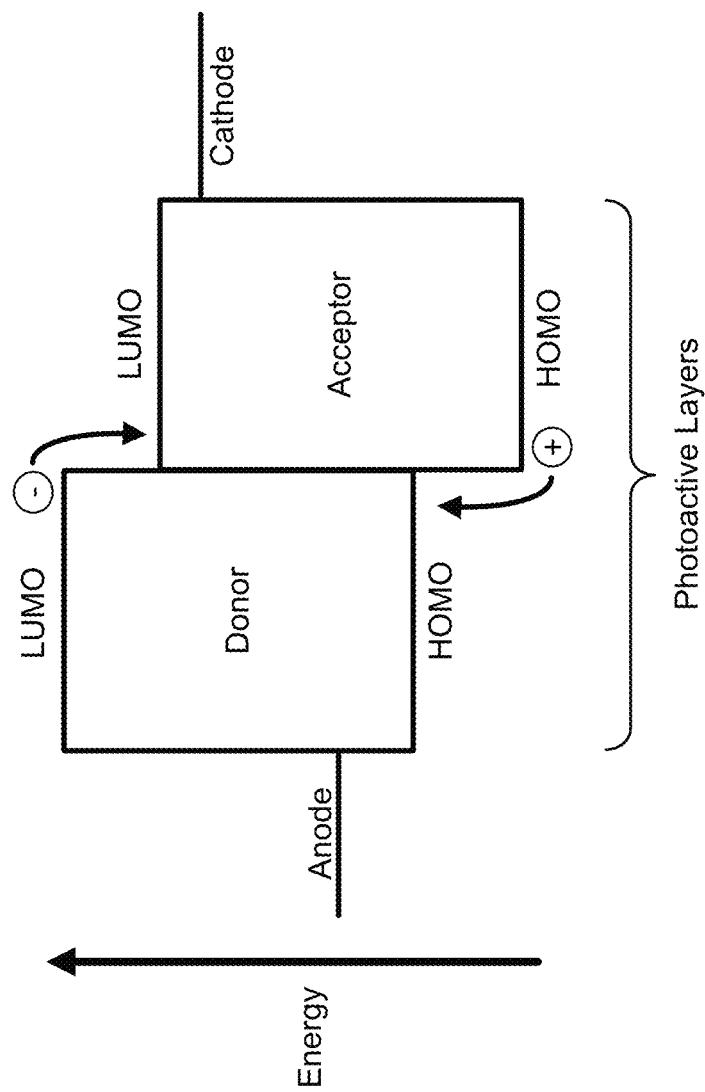
FIG. 4 illustrates a schematic energy level diagram overview for operation of an example organic photovoltaic device without any charge transport layers, such as a visibly transparent photovoltaic device.

FIG. 4 illustrates a schematic energy level diagram overview for operation of an example organic photovoltaic device, such as visibly transparent photovoltaic device 100. For example, in such a photovoltaic device, various photoactive materials may exhibit electron donor or electron acceptor characteristics, depending on their molecular properties and the types of materials that are used for buffer layers, electrodes, etc. As depicted in FIG. 4, each of the donor and acceptor materials has a HOMO and a LUMO. A transition of an electron from the HOMO to the LUMO may be imparted by absorption of photons. The energy between the HOMO and the LUMO (the HOMO-LUMO gap) of a material represents approximately the energy of the optical band gap of the material. For the electron donor and electron acceptor materials useful with the transparent photovoltaic devices provided herein, the HOMO-LUMO gap for the electron donor and electron acceptor materials may optionally fall outside the energy of photons in the visible range. For example, the HOMO-LUMO gap may be in the ultraviolet region or the near-infrared region, depending on the photoactive materials. It will be appreciated that the HOMO is comparable to the valence band in conventional conductors or semiconductors, while the LUMO is comparable to the conduction band in conventional conductors or semiconductors.

The buffer layer adjacent to the donor, generally referred to as the anode buffer layer or hole transport layer, is selected such that HOMO level or valence band (in the case of inorganic materials) of the buffer layer is aligned in the energy landscape with the HOMO level of the donor to transport holes from the donor to the anode (transparent electrode). In some embodiments, it may be useful for the buffer layer to have high hole mobility. The buffer layer adjacent to the acceptor, generally referred to as the cathode buffer layer or electron transport layer, is selected such that LUMO level or conduction band (in the case of inorganic materials) of the buffer layer is aligned in the energy landscape with the LUMO level of the acceptor to transport electrons from the acceptor to the cathode (transparent electrode). In some embodiments, it may be useful for the buffer layer to have high electron mobility.

Figures 5A, 5B:
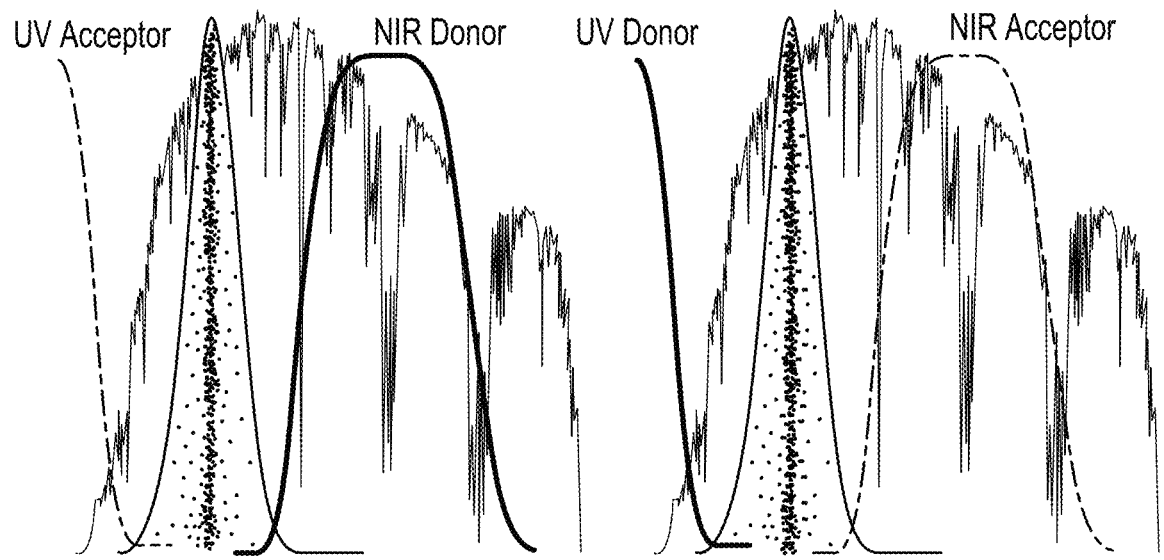
FIG. 5A-5D illustrate various plots showing example absorption bands for different electron donor and electron acceptor configurations useful with visibly transparent photovoltaic devices.

FIG. 5A-5D illustrate various plots showing example absorption bands for different electron donor and electron acceptor configurations useful with visibly transparent photovoltaic devices. In FIG. 5A, the donor material exhibits absorption in the NIR, while the acceptor material exhibits absorption in the UV. FIG. 5B depicts the opposite configuration, where the donor material exhibits absorption in the UV, while the acceptor material exhibits absorption in the NIR.

Figures 5C, 5D:
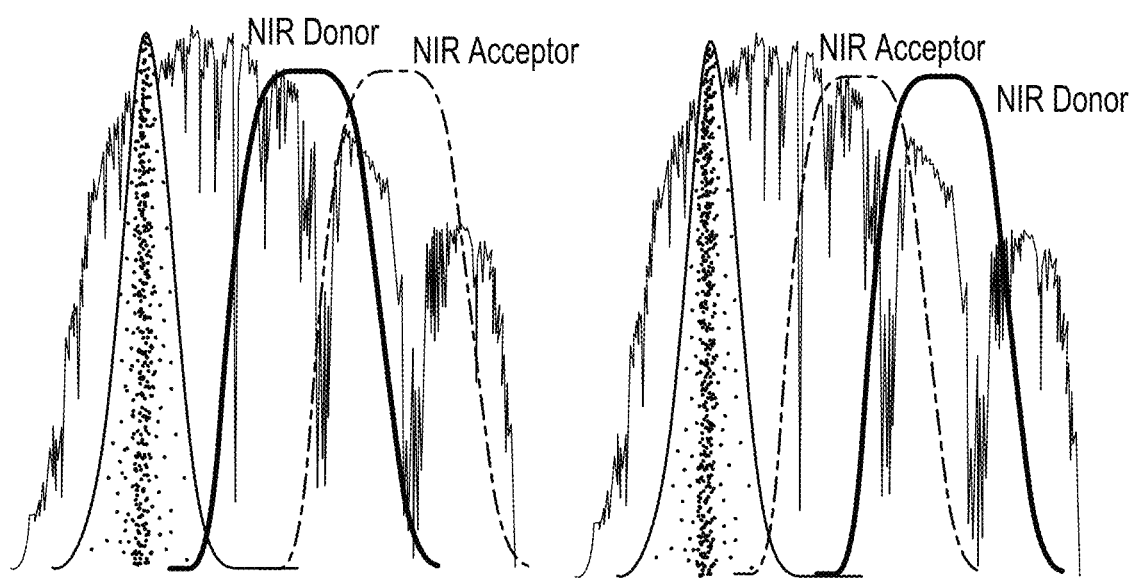

FIG. 5C depicts an additional configuration, where both the donor and acceptor materials exhibit absorption in the NIR. As illustrated in the figures, the solar spectrum exhibits significant amounts of useful radiation in the NIR with only relatively minor amounts in the ultraviolet, making the configuration depicted in FIG. 5C useful for capturing a large amount of energy from the solar spectrum. It will be appreciated that other embodiments are contemplated where both the donor and acceptor materials exhibit absorption in the NIR, such as depicted in FIG. 5D where the acceptor is blue shifted relative to the donor, opposite the configuration depicted in FIG. 5C, where the donor is blue shifted relative to the acceptor.

Figure 6:
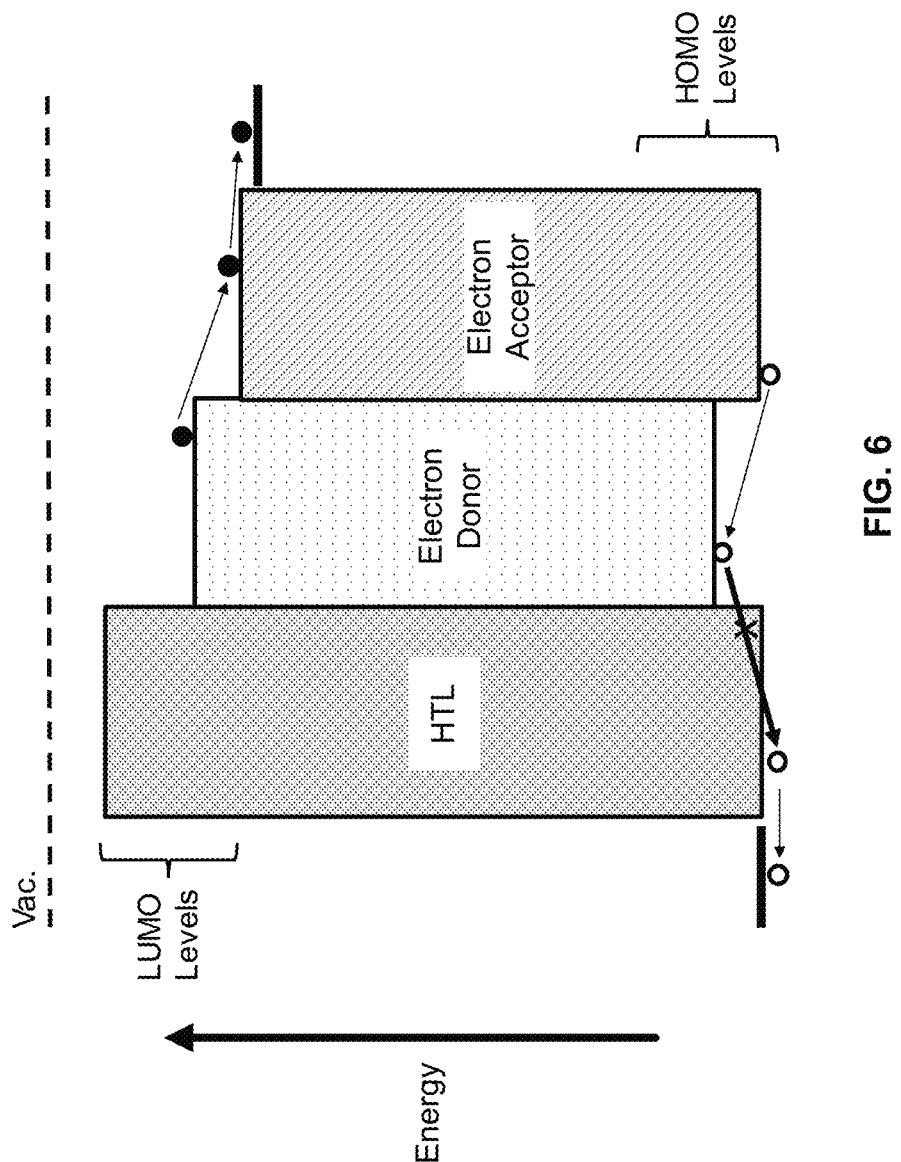
FIG. 6 illustrates a schematic energy level diagram of an example organic photovoltaic device exhibiting a charge extraction barrier for holes due to a misalignment of the HOMO levels at the HTL/donor interface.

FIG. 6 illustrates a schematic energy level diagram of an example organic photovoltaic device, according to some embodiments. The example organic photovoltaic device includes an HTL, an electron donor material, and an electron acceptor material. The HTL is coupled to the electron donor material and the electron donor material is coupled to the electron acceptor material. As illustrated, the HOMO level of the HTL is deeper than the HOMO level of the electron donor material such that an extraction barrier for holes is formed; photogenerated holes are unable to efficiently move from the electron donor material through the HTL to the anode. Such an arrangement of materials can lead to a suppression of photocurrent from the photovoltaic device.

Figure 7:
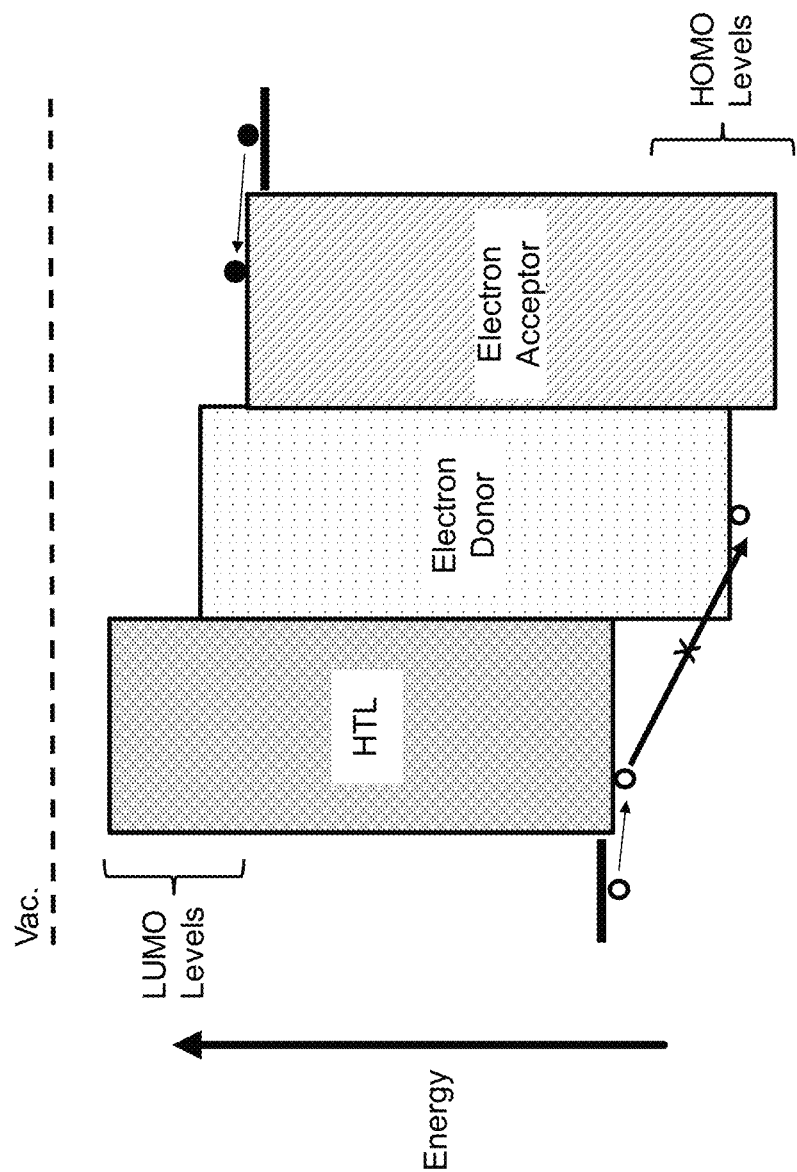
FIG. 7 illustrates a schematic energy level diagram of an example organic photovoltaic device exhibiting a charge injection barrier for holes due to a misalignment of the HOMO levels at the HTL/donor interface.

FIG. 7 illustrates a schematic energy level diagram of an example organic photovoltaic device, according to some embodiments. The example organic photovoltaic device is similar to the device of FIG. 6 except that the HOMO level of the HTL is shallower than the HOMO level of the electron donor material. As illustrated, holes are unable to efficiently inject from the HTL into the electron donor material. Such an arrangement of materials can lead to a suppression of the built-in potential and a reduction of the dark current passing through the device under forward bias. This may result in s-kinked current-voltage curves, reduced fill factor (FF), and reduced open-circuit voltage ($V_{oc}$).

Figure 8:
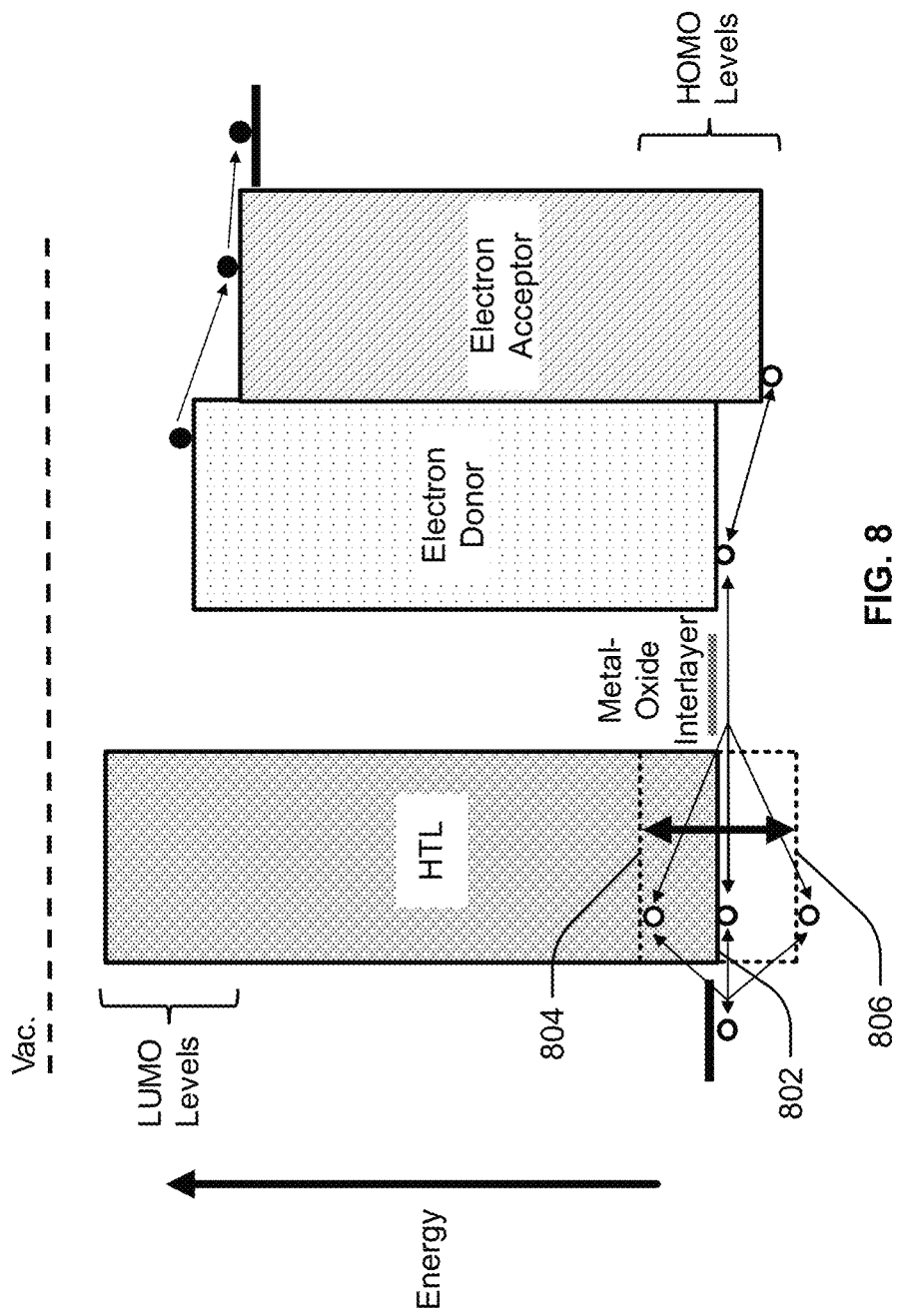
FIG. 8 illustrates a schematic energy level diagram of an example organic photovoltaic device employing a compound HTL that exhibits barrier-free charge transport, according to some embodiments of the invention.

FIG. 8 illustrates a schematic energy level diagram of an example organic photovoltaic device, according to some embodiments. The example organic photovoltaic device includes an HTL, a metal-oxide interlayer, an electron donor material, and an electron acceptor material. The HTL is coupled to the metal-oxide interlayer, the metal-oxide interlayer is coupled to the electron donor material, and the electron donor material is coupled to the electron acceptor material. The metal-oxide interlayer provides an ohmic connection between the adjacent HTL and electron donor layers. As a result, there is neither an extraction nor an injection barrier at the interface of the HTL and electron donor material, as is illustrated in FIGS. 6 and 7. The combination of the HTL and the metal-oxide interlayer may be referred to as a compound HTL.

As illustrated, for a first HOMO level 802 of the HTL that is equal to the HOMO level of the electron donor material, holes are able to move barrier-free from the HTL through the electron donor material as well as from the electron donor material through the HTL. Similarly, for a different HTL material with a second HOMO level 804 that is higher than the HOMO level of the electron donor material, holes are again able to move barrier-free from the HTL through the electron donor material as well as from the electron donor material through the HTL. Similarly, for a different HTL material with a third HOMO level 806 that is lower than the HOMO level of the electron donor material, holes are again able to move barrier-free from the HTL through the electron donor material as well as from the electron donor material through the HTL. Due to the ohmic contact at the HTL/metal-oxide and metal-oxide/donor interfaces, the presence of the metal-oxide interlayer decouples the HOMO level of the HTL from the HOMO level of the electron donor material and therefore enables a wide range of HTL materials with different energy levels to be used.

Figure 9:
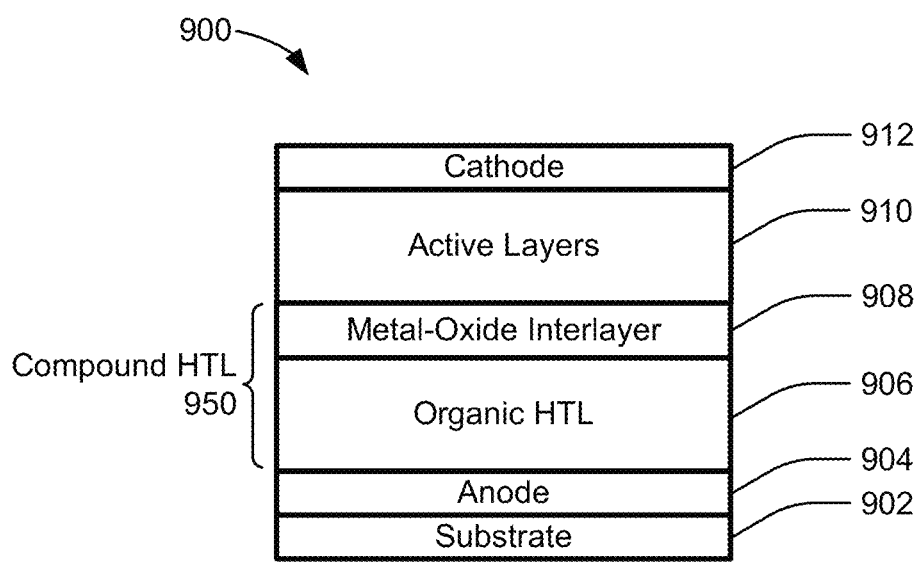
FIG. 9 illustrates a device structure for an example organic photovoltaic device having a single compound HTL.

FIG. 9 illustrates a device structure 900 for an example organic photovoltaic device having a single compound HTL 950, according to some embodiments of the present invention. Device structure 900 may include a substrate 902, an anode 904 disposed above and/or formed onto substrate 902, an organic HTL 906 disposed above and/or formed onto anode 904, a metal-oxide interlayer 908 disposed above and/or formed onto organic HTL 906, one or more active layers 910 disposed above and/or formed onto metal-oxide interlayer 908, and a cathode 912 disposed above and/or formed onto active layers 910.

During operation, device structure 900 receives light that passes through cathode 912 and/or anode 904 and is partially absorbed by active layers 910 (e.g., the UV and/or NIR wavelengths of the received light). The absorbed light causes a separation of charge carriers of opposite types in active layers 910, with electrons moving from active layers 910 upward through cathode 912 and holes moving from active layers 910 downward through metal-oxide interlayer 908, organic HTL 906, and anode 904. As described in reference to FIG. 8, any misalignment between the HOMO levels of active layers 910 and organic HTL 906 that would otherwise prevent movement of holes downward from active layers 910 through organic HTL 906 is mitigated by the presence of metal-oxide interlayer 908.

Figure 10:
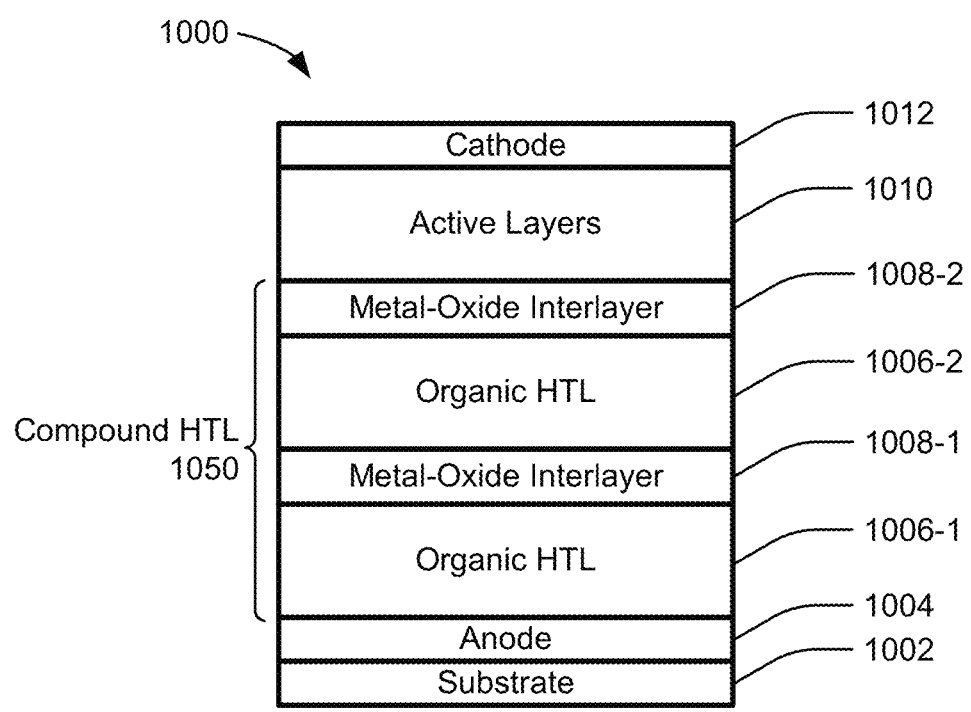
FIG. 10 illustrates a device structure for an example organic photovoltaic device having a multilayer compound HTL.

FIG. 10 illustrates a device structure 1000 for an example organic photovoltaic device having a multilayer compound HTL 1050, according to some embodiments of the present invention. Device structure 1000 may include a substrate 1002, an anode 1004 disposed above and/or formed onto substrate 1002, a first organic HTL 1006-1 disposed above and/or formed onto anode 1004, a first metal-oxide interlayer 1008-1 disposed above and/or formed onto organic HTL 1006-1, a second organic HTL 1006-2 disposed above and/or formed onto metal-oxide interlayer 1008-1, a second metal-oxide interlayer 1008-2 disposed above and/or formed onto organic HTL 1006-2, one or more active layers 1010 disposed above and/or formed onto metal-oxide interlayer 1008-2, and a cathode 1012 disposed above and/or formed onto active layers 1010.

Device structure 1000 differs from device structure 900 by including a second compound HTL comprising organic HTL 1006-2 and metal-oxide interlayer 1008-2, which can provide additional decoupling of HOMO levels. During operation, device structure 1000 receives light that passes through cathode 1012 and/or anode 1004 and is partially absorbed by active layers 1010 (e.g., the UV and/or NIR wavelengths of the received light). The absorbed light causes a separation of charge carriers of opposite types in active layers 1010, with electrons moving from active layers 1010 upward through cathode 1012 and holes moving from active layers 1010 downward through metal-oxide interlayer 1008-2, organic HTL 1006-2, metal-oxide interlayer 1008-1, organic HTL 1006-1, and anode 1004. As described in reference to FIG. 8, any misalignment between the HOMO levels of active layers 1010 and organic HTLs 1006 that would otherwise prevent movement of holes downward from active layers 1010 through organic HTLs 1006 is mitigated by the presence of metal-oxide interlayers 1008.

Figure 11:
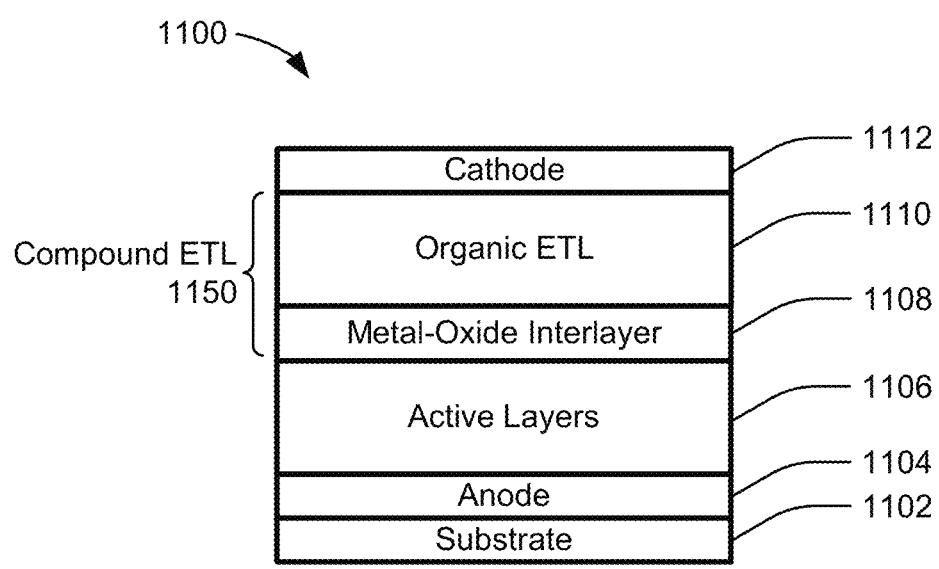
FIG. 11 illustrates a device structure for an example organic photovoltaic device having a single compound ETL.

FIG. 11 illustrates a device structure 1100 for an example organic photovoltaic device having a single compound ETL 1150, according to some embodiments of the present invention. Device structure 1100 may include a substrate 1102, an anode 1104 disposed above and/or formed onto substrate 1102, one or more active layers 1106 disposed above and/or formed onto anode 1104, a metal-oxide interlayer 1108 disposed above and/or formed onto active layers 1106, an organic ETL 1110 disposed above and/or formed onto metal-oxide interlayer 1108, and a cathode 1112 disposed above and/or formed onto organic ETL 1110.

During operation, device structure 1100 receives light that passes through cathode 1112 and/or anode 1104 and is partially absorbed by active layers 1106 (e.g., the UV and/or NIR wavelengths of the received light). The absorbed light causes a separation of charge carriers of opposite types in active layers 1106, with electrons moving from active layers 1106 upward through metal-oxide interlayer 1108, organic ETL 1110, and cathode 1112 and holes moving from active layers 1106 downward through anode 1104. Similar to that described in reference to FIG. 8, any misalignment between the LUMO levels of active layers 1106 and organic ETL 1110 that would otherwise prevent movement of electrons upward from active layers 1106 through organic ETL 1110 is mitigated by the presence of metal-oxide interlayer 1108.

Figure 12:
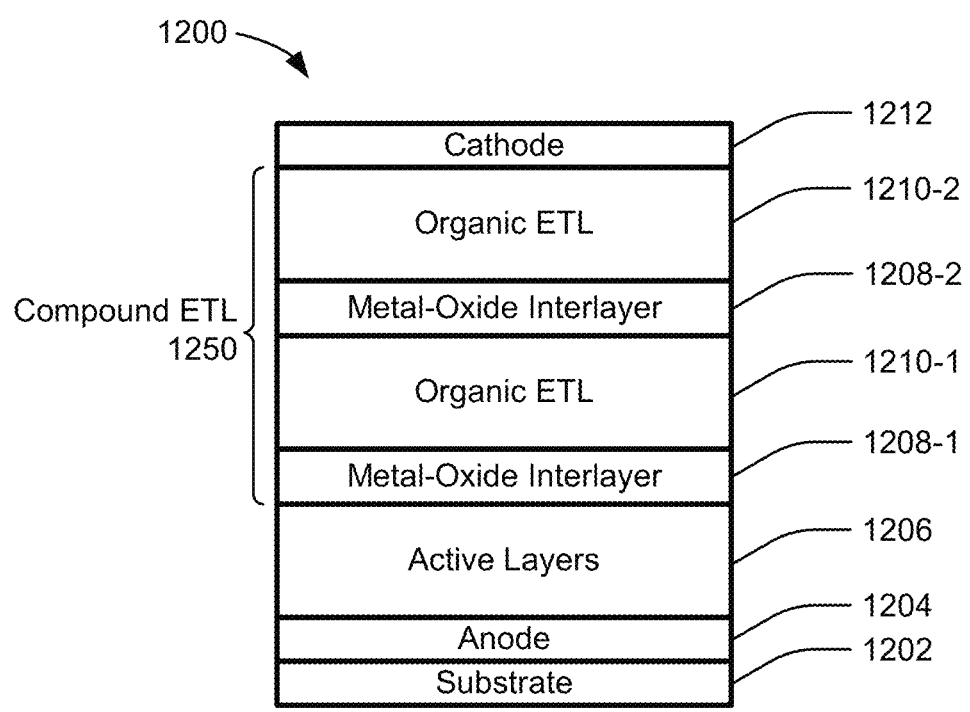
FIG. 12 illustrates a device structure for an example organic photovoltaic device having a multilayer compound ETL.

FIG. 12 illustrates a device structure 1200 for an example organic photovoltaic device having a multilayer compound ETL 1250, according to some embodiments of the present invention. Device structure 1200 may include a substrate 1202, an anode 1204 disposed above and/or formed onto substrate 1202, one or more active layers 1206 disposed above and/or formed onto anode 1204, a first metal-oxide interlayer 1208-1 disposed above and/or formed onto active layers 1206, a first organic ETL 1210-1 disposed above and/or formed onto metal-oxide interlayer 1208-1, a second metal-oxide interlayer 1208-2 disposed above and/or formed onto organic ETL 1210-1, a second organic ETL 1210-2 disposed above and/or formed onto metal-oxide interlayer 1208-2, and a cathode 1212 disposed above and/or formed onto organic ETL 1210-2.

During operation, device structure 1200 receives light that passes through cathode 1212 and/or anode 1204 and is partially absorbed by active layers 1206 (e.g., the UV and/or NIR wavelengths of the received light). The absorbed light causes a separation of charge carriers of opposite types in active layers 1206, with electrons moving from active layers 1206 upward through metal-oxide interlayer 1208-1, organic ETL 1210-1, metal-oxide interlayer 1208-2, organic ETL 1210-2, and cathode 1212 and holes moving from active layers 1206 downward through anode 1204. Similar to that described in reference to FIG. 8, any misalignment between the LUMO levels of active layers 1206 and organic ETLs 1210 that would otherwise prevent movement of electrons upward from active layers 1206 through organic ETLs 1210 is mitigated by the presence of metal-oxide interlayer 1208.

Figure 13:
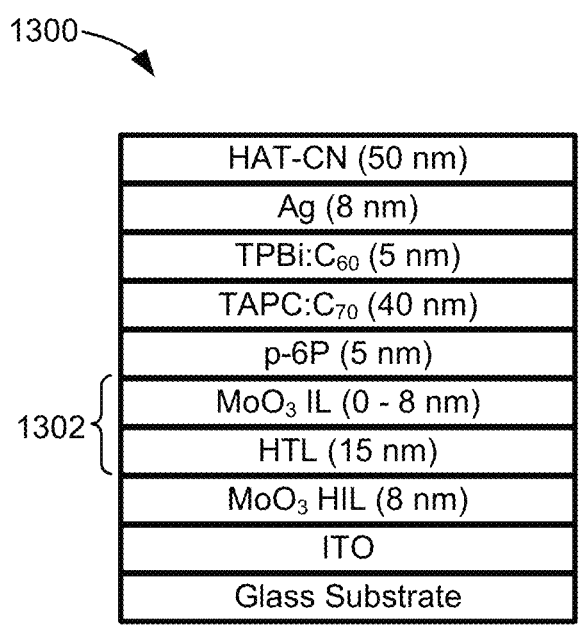
FIG. 13 illustrates a device structure for an example organic photovoltaic device having a single compound HTL with a varying metal-oxide interlayer thickness.

FIG. 13 illustrates a device structure 1300 for an example organic photovoltaic device having a single compound HTL 1302, according to some embodiments of the present invention. Device structure 1300 may correspond to an example implementation of device structure 900 described in reference to FIG. 9 that includes a single compound HTL. Accordingly, operation of device structure 1300 may be similar to that described in reference to device structure 900. Device structure 1300 includes a glass substrate (corresponding to substrate 902), an ITO layer (corresponding to anode 904), a MoO$_3$ hole-injection layer (HIL) (corresponding to a metal-oxide layer), an HTL (corresponding to organic HTL 906), a MoO$_3$ IL (corresponding to metal-oxide interlayer 908), a p-6P layer (corresponding to a p-phenylene layer), a TAPC:C$_{70}$ blend (corresponding to active layers 910) and a TPBi:C$_{60}$ blend (corresponding to an organic buffer layer), an Ag layer (corresponding to cathode 912), and a HAT-CN layer (corresponding to an optical anti-reflection layer).

Figure 14A:
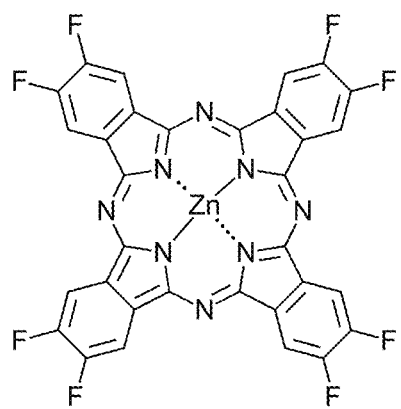
FIG. 14A-14D illustrate some example materials that can be utilized in an HTL.
Figure 14B:
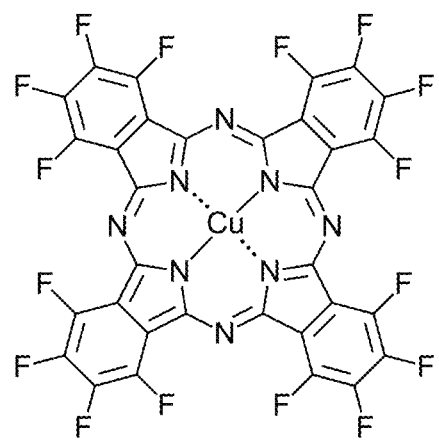
Figure 14C:
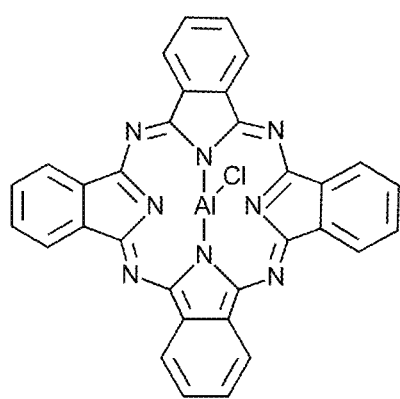
Figure 14D:
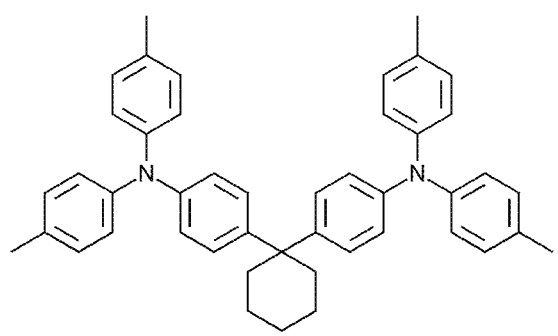

FIG. 14A-14D illustrate a selection of various materials that can be utilized in the HTL of device structure 1300. The HTL may also include, but is not limited to, materials such as those listed in reference to buffer layers 130 and 132. FIG. 14A-14C illustrates an F$_8$ZnPc, an F$_{16}$CuPc molecule, and a ClAlPc molecule of the phthalocyanine class of organic compounds, respectively. FIG. 14D illustrates a TAPC molecule of the triarylamine class of compounds.

Figure 15:
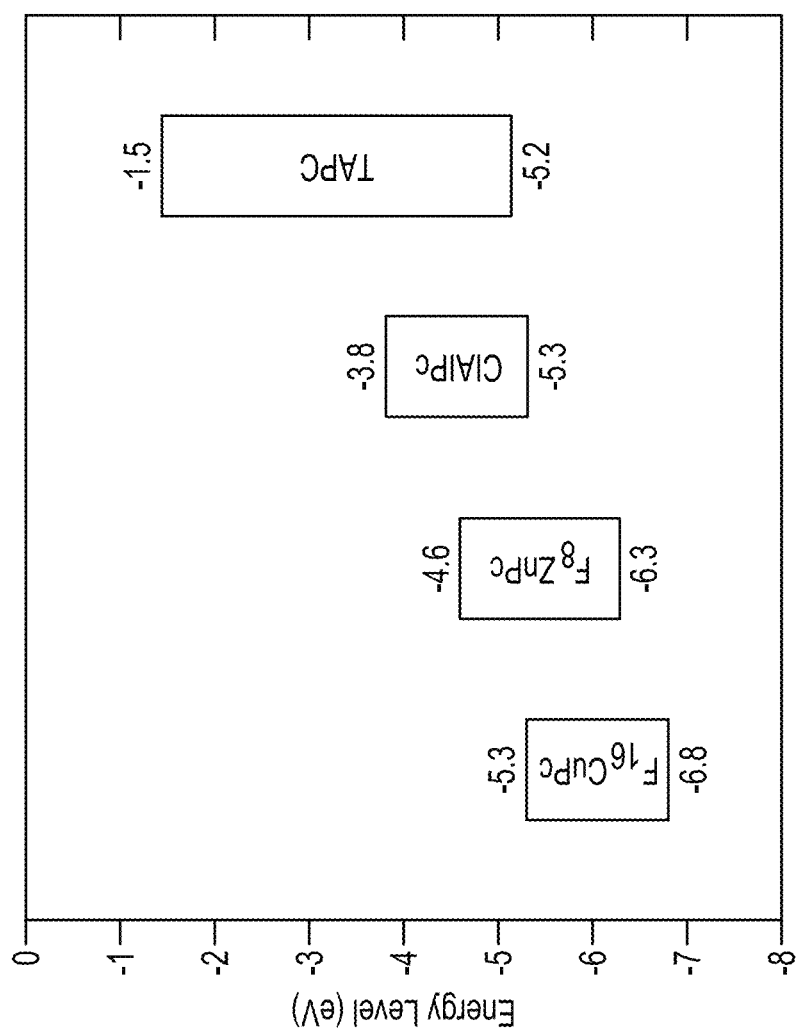
FIG. 15 illustrates energy levels associated with the various materials of FIG. 14.

FIG. 15 illustrates energy levels associated with F$_8$ZnPc, F$_{16}$CuPc, ClAlPc, and TAPC materials used as HTLs according to some embodiments of this invention. As shown in FIG. 15, the HOMO levels of the materials span approximately 1.6 eV (−6.8 eV to −5.2 eV), thus providing a wide range of energy levels to be used in the HTL.

Figure 16A:
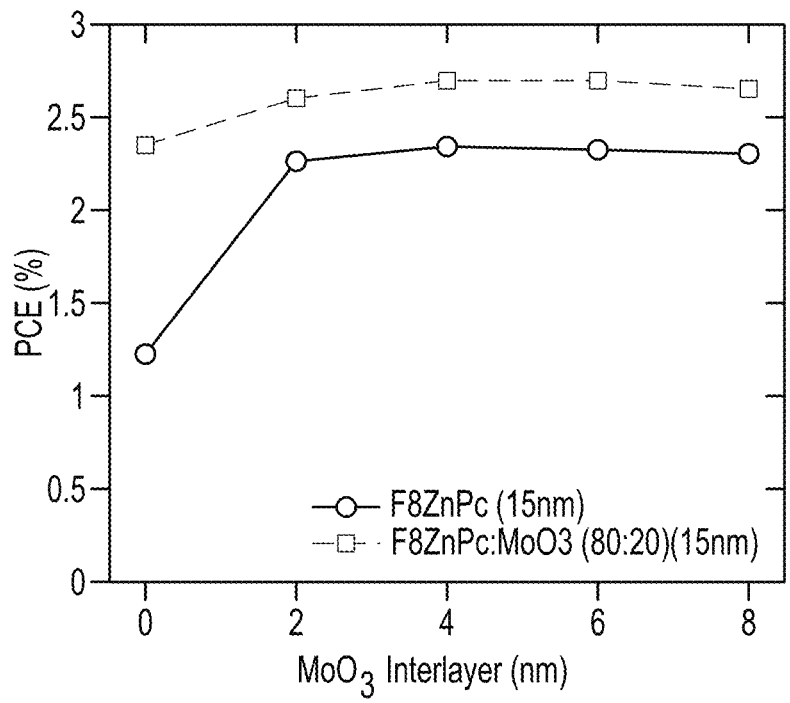
FIG. 16A-16D illustrate plots showing measured power conversion efficiency as a function of metal-oxide interlayer thickness for various organic photovoltaic devices employing the device structure of FIG. 13 and the HTL materials of FIGS. 14 and 15.

FIG. 16A-16D illustrate plots showing the power conversion efficiency (PCE) as a function of metal-oxide interlayer thickness for various organic photovoltaic devices. FIG. 16A illustrates a plot showing PCE as a function of metal-oxide interlayer thickness of device structure 1300 with a F$_8$ZnPc material used as the HTL. The solid line corresponds to the HTL having only the F$_8$ZnPc material and the dashed line corresponds to the HTL having a 20 vol % doping of the F$_8$ZnPc material with MoO$_3$. As shown in FIG. 16A, improvements can be achieved to the PCE by increasing the interlayer thickness (for low interlayer thicknesses) and/or by doping the HTL with MoO$_3$.

Improvements to the PCE between interlayer thicknesses of 0 nm and 2 nm can be attributed to the decoupling effect of the HOMO levels of the F$_8$ZnPc material and the TAPC:C$_{70}$ blend provided by the MoO$_3$ IL. While increasing the interlayer thickness from 0 nm to 2 nm and then again to 4 nm was found to increase the PCE for both the doped and undoped HTL, the PCE for the doped HTL without an interlayer (thickness equal to 0 nm) was found to be greater than the PCE for the undoped HTL at all interlayer thicknesses.

Figure 16B:
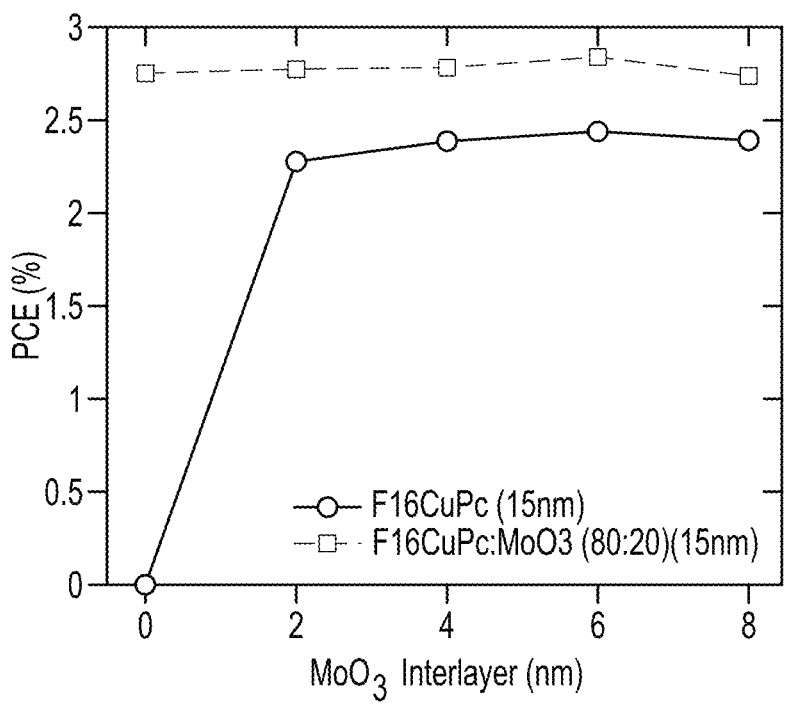

FIG. 16B illustrates a plot showing PCE as a function of metal-oxide interlayer thickness of device structure 1300 with a F$_{16}$CuPc material used as the HTL. The solid line corresponds to the HTL having only the F$_{16}$CuPc material and the dashed line corresponds to the HTL having a 20 vol % doping of the F$_{16}$CuPc material with MoO$_3$. Similar to FIG. 16A, FIG. 16B demonstrates improvements to the PCE by increasing the interlayer thickness (for low interlayer thicknesses) and/or by doping the HTL with MoO$_3$. For the undoped HTL, the improvement in the PCE was found to be significant when increasing the interlayer thickness from 0 nm to 2 nm, with small improvements thereafter from 2 nm to 6 nm. This improvement can be attributed to the decoupling effect of the HOMO levels of the F$_{16}$CuPc material and the TAPC:C$_{70}$ blend provided by the MoO$_3$ IL. In contrast, for the doped HTL, the improvements in the PCE were less significant yet were still observed when increasing the interlayer thickness from 0 nm to 6 nm.

Figure 16C:
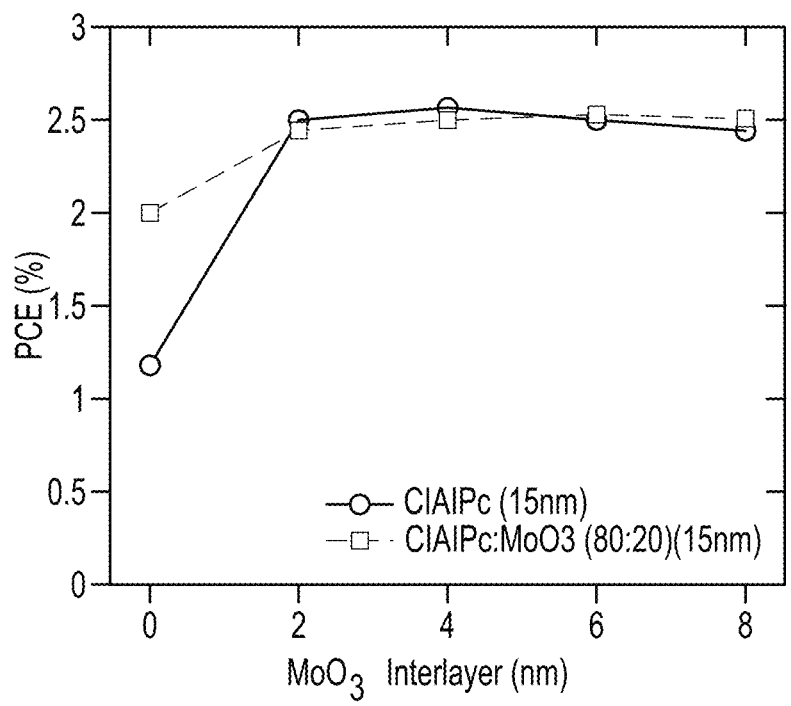

FIG. 16C illustrates a plot showing PCE as a function of metal-oxide interlayer thickness of device structure 1300 with a ClAlPc material used as the HTL. The solid line corresponds to the HTL having only the ClAlPc material and the dashed line corresponds to the HTL having a 20 vol % doping of ClAlPc with MoO$_3$. In contrast to FIGS. 16A and 16B, FIG. 16C demonstrates that for some materials extrinsic doping of the HTL may not provide significant improvements to the PCE beyond that provided by increasing the interlayer thickness.

Improvements to the PCE between interlayer thicknesses of 0 nm and 2 nm can be attributed to the decoupling effect of the HOMO levels of the ClAlPc material and the TAPC:C$_{70}$ blend provided by the MoO$_3$ IL. Notably, between an interlayer thickness of 2 nm and 4 nm, the undoped HTL outperformed the doped HTL, while increasing the interlayer thickness beyond 4 nm caused the PCE to decrease for the undoped HTL.

Figure 16D:
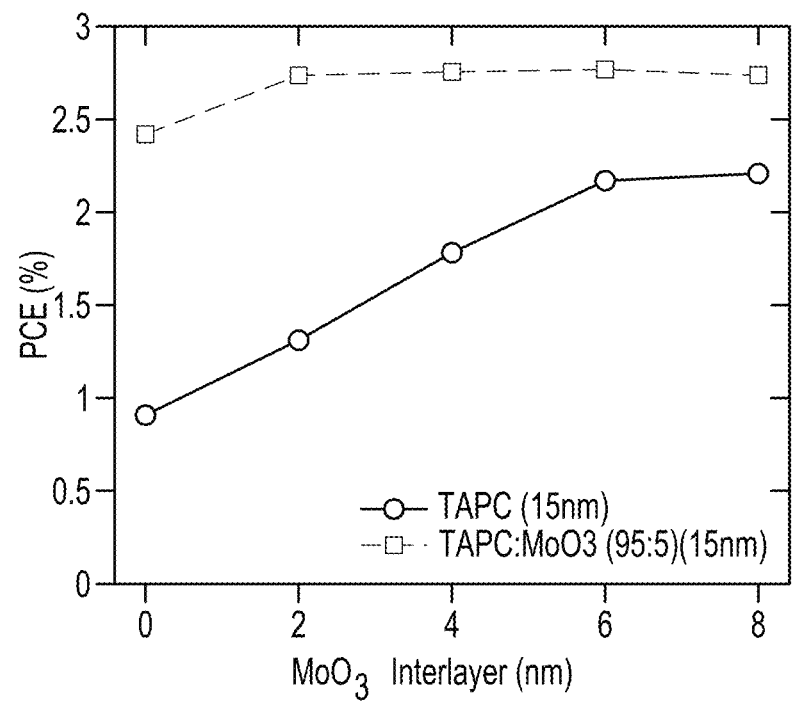

FIG. 16D illustrates a plot showing PCE as a function of metal-oxide interlayer thickness of device structure 1300 with a TAPC material used as the HTL. The solid line corresponds to the HTL having only the TAPC material and the dashed line corresponds to the HTL having a 5 vol % doping of the TAPC material with MoO$_3$. Similar to FIGS. 16A and 16B, FIG. 16D demonstrates significant improvements to the PCE by increasing the interlayer thickness and/or by doping the HTL with MoO$_3$.

Notably, for the undoped HTL, steady and roughly linear improvements to the PCE are observed by increasing the interlayer thickness from 0 nm to 2 nm, from 2 nm to 4 nm, and from 4 nm to 6 nm. For the doped HTL, the greatest gains in the PCE were observed between interlayer thickness of 0 nm and 2 nm, with less significant improvements thereafter. Similar to FIG. 16A, the PCE for the doped HTL without an interlayer (thickness equal to 0 nm) was found to be greater than the PCE for the undoped HTL at all interlayer thicknesses.

FIGS. 16A-16D illustrate the generality of the compound HTL concept. It can be applied to HTL materials that require extrinsic doping for efficient charge transport (FIG. 16D) as well as materials that may sufficiently transport charge but lack proper energy level alignment with the active layers (FIGS. 16A-C). The approach works across a wide range of HTL compounds regardless of their energy levels, as these are decoupled from the energy levels of the active layers. For example, no power generation is achieved with F$_{16}$CuPc without either extrinsic doping and/or MoO$_3$ interlayer incorporation (FIG. 16B). In cases where extrinsic doping is used, the compound HTL approach further improves performance.

Figure 17:
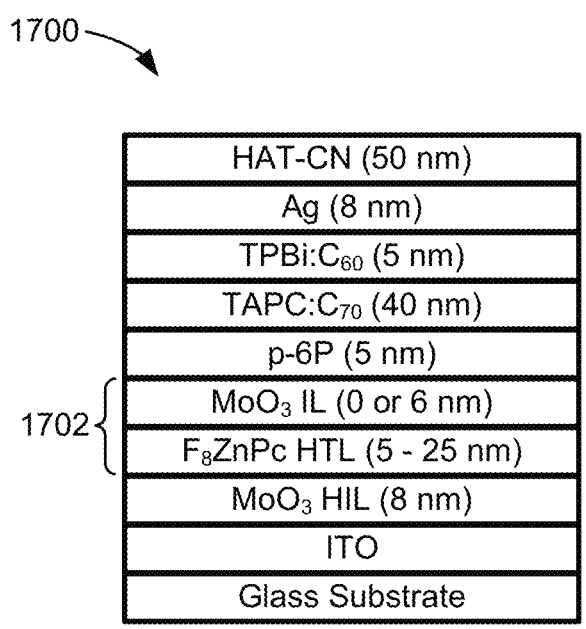
FIG. 17 illustrates a device structure for an example organic photovoltaic device having a single compound HTL with a varying organic HTL thickness.

FIG. 17 illustrates a device structure 1700 for an example organic photovoltaic device having a single compound HTL 1702, according to some embodiments of the present invention. Device structure 1700 may correspond to an example implementation of device structure 900 described in reference to FIG. 9 that includes a single compound HTL comprising a variable F$_8$ZnPc HTL (with a thickness between 5 and 25 nm) and a metal-oxide interlayer. Accordingly, operation of device structure 1700 may be similar to that described in reference to device structure 900.

Device structure 1700 includes a glass substrate (corresponding to substrate 902), an ITO layer (corresponding to anode 904), a MoO$_3$ HIL (corresponding to a metal-oxide hole-injection layer), a F$_8$ZnPc HTL (corresponding to organic HTL 906), a MoO$_3$ IL (corresponding to metal-oxide interlayer 908), a p-6P layer (corresponding to a p-phenylene buffer layer), a TAPC:C$_{70}$ blend (corresponding to active layers 910) and a TPBi:C$_{60}$ blend (corresponding to an organic buffer layer), an Ag layer (corresponding to cathode 912), and a HAT-CN layer (corresponding to an optical anti-reflection layer).

Figure 18A:
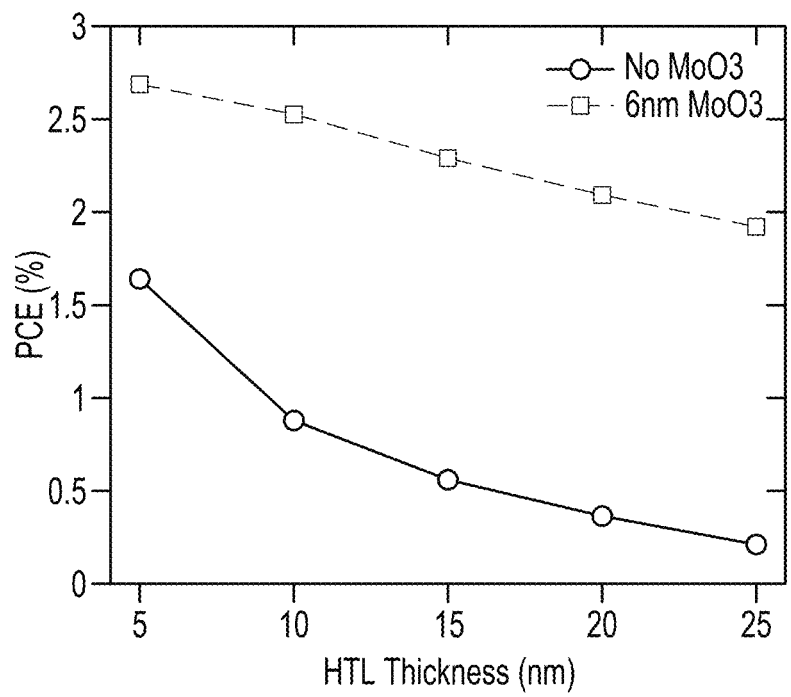
FIG. 18A-18C illustrate plots showing experimental performance and color values acquired for the transparent organic photovoltaic devices of FIG. 17 as a function of organic HTL thickness.
Figure 18B:
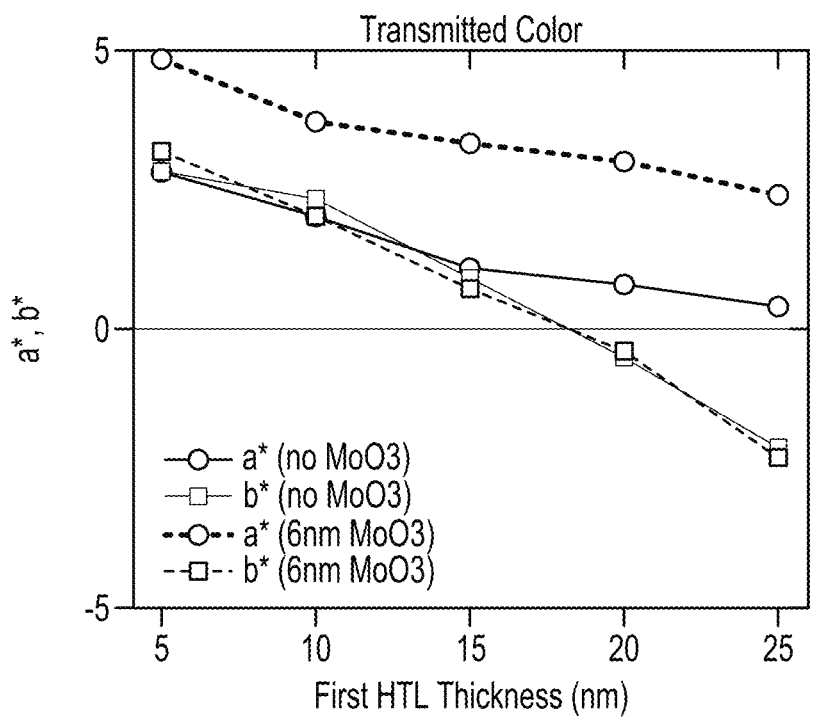
Figure 18C:
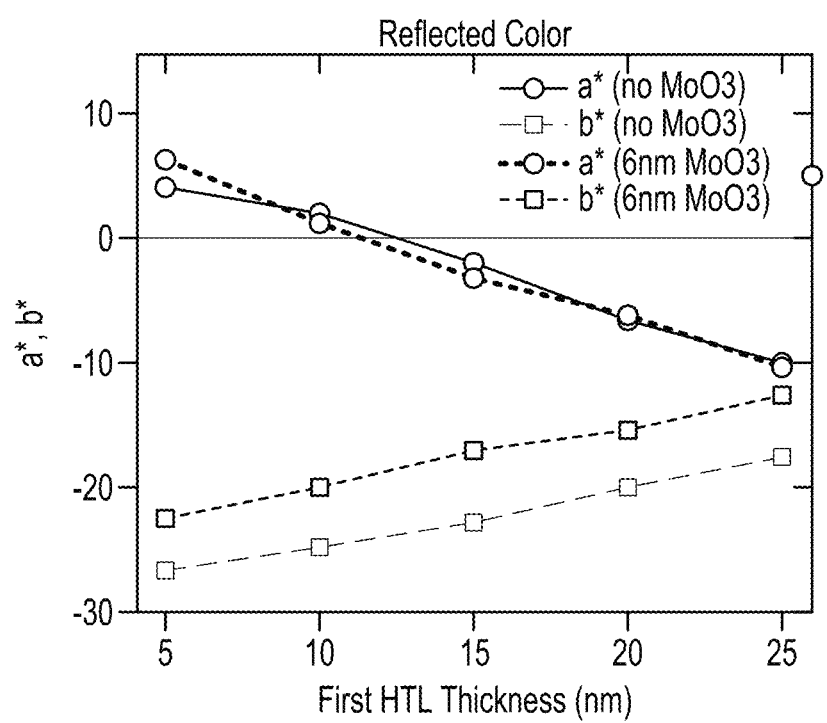

FIG. 18A-18C illustrate plots showing experimental values acquired for an organic photovoltaic device having device structure 1700. FIG. 18A illustrates a plot showing PCE as a function of HTL thickness. The dashed line corresponds to device structure 1700 including a metal-oxide interlayer with a thickness of 6 nm and the solid line corresponds to device structure 1700 without a metal-oxide interlayer. As shown in FIG. 18A, inclusion of the metal-oxide interlayer causes an immediate improvement to the PCE across all measured HTL thicknesses, and greater gains in the measured PCEs are achieved at greater thicknesses. Due to a progressive increase in electrical resistance, PCE decreases with increasing HTL thickness beyond 5 nm. However, the inclusion of the metal-oxide interlayer provides a significant reduction in resistance for all thicknesses due to contact doping at the interface with the HTL, allowing for thicker HTLs to be used without extrinsic doping.

FIG. 18B illustrates a plot showing transmitted color parameters a* and b* as a function of HTL thickness. The dashed lines correspond to device structure 1700 including a metal-oxide interlayer with a thickness of 6 nm and the solid lines correspond to device structure 1700 without a metal-oxide interlayer. FIG. 18C illustrates a plot showing reflected color parameters a* and b* as a function of HTL thickness. The dashed lines corresponds to device structure 1700 including a metal-oxide interlayer with a thickness of 6 nm and the solid lines correspond to device structure 1700 without a metal-oxide interlayer. FIG. 18C demonstrates the significant effect that the thickness of the HTL material can have on the reflected color. For device structure 1700 employing a metal-oxide interlayer, the color can be tuned across a wide range with minimal PCE loss.

Figure 19A:
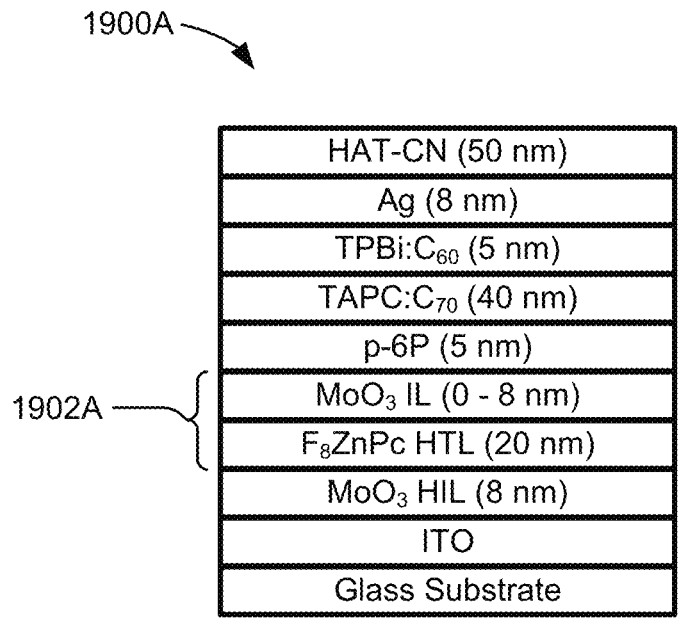
FIG. 19A-19C illustrate device structures for example organic photovoltaic devices having multilayer compound HTLs with a fixed total HTL thickness split into a varying number of multilayers.
Figure 19B:
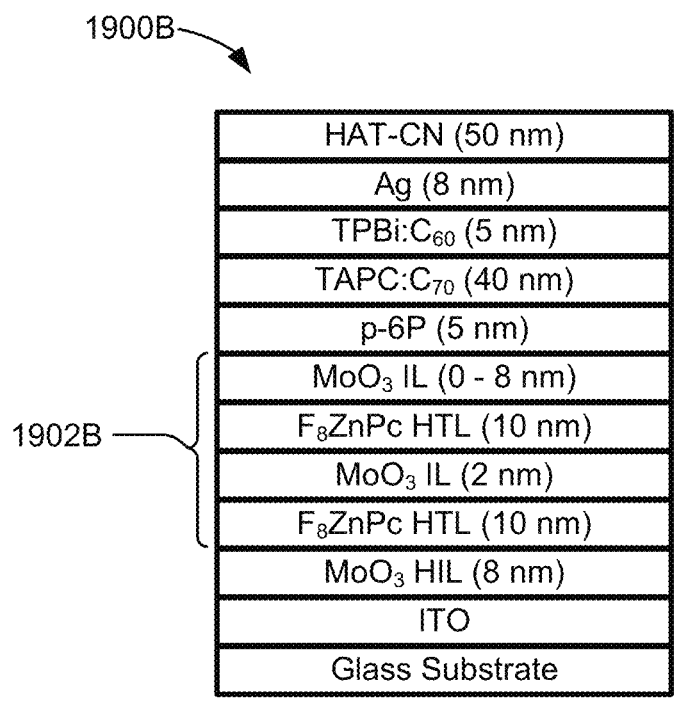
Figure 19C:
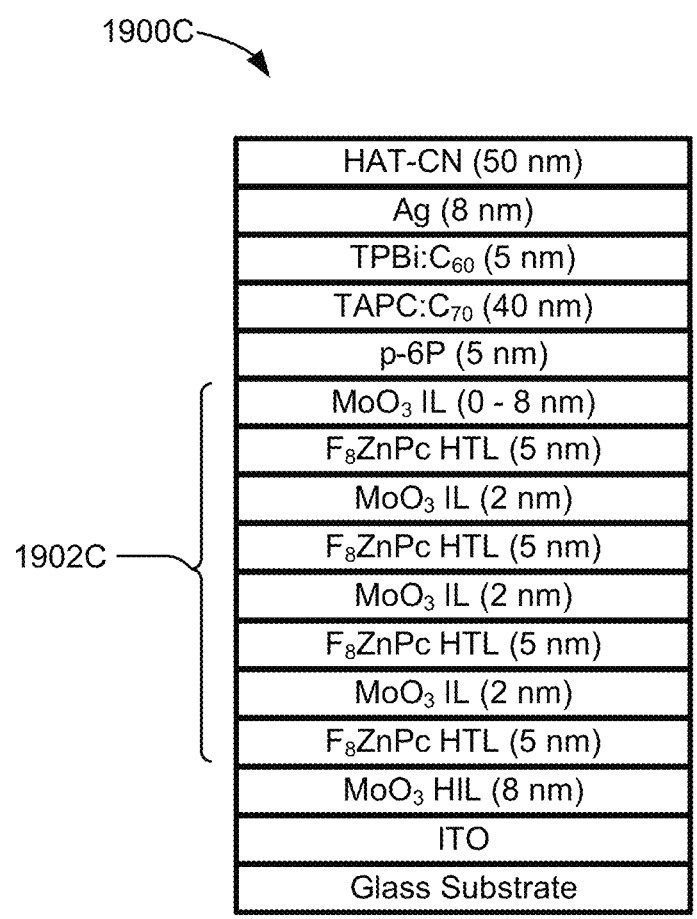

FIG. 19A-19C illustrate device structures 1900 for example organic photovoltaic devices having compound HTLs 1902, according to some embodiments of the present invention. FIG. 19A illustrates a device structure 1900A for an example organic photovoltaic device having a single compound HTL 1902A. Device structure 1900A may correspond to an example implementation of device structure 900 described in reference to FIG. 9. Accordingly, operation of device structure 1900A may be similar to that described in reference to device structure 900. Device structure 1900A includes a glass substrate (corresponding to substrate 902), an ITO layer (corresponding to anode 904), a $MoO_3$ HIL (corresponding to a metal-oxide hole-injection layer), a $F_8ZnPc$ HTL (corresponding to organic HTL 906), a $MoO_3$ IL (corresponding to metal-oxide interlayer 908), a p-6P layer, a $TAPC:C_{70}$ blend (corresponding to active layers 910) and a $TPBi:C_{60}$ blend (corresponding to an organic buffer layer), an Ag layer (corresponding to cathode 912), and a HAT-CN layer.

FIG. 19B illustrates a device structure 1900B for an example organic photovoltaic device having a multilayer compound HTL 1902B. Device structure 1900B may correspond to an example implementation of device structure 1000 described in reference to FIG. 10. Accordingly, operation of device structure 1900B may be similar to that described in reference to device structure 1000. Device structure 1900B includes a glass substrate (corresponding to substrate 1002), an ITO layer (corresponding to anode 1004), a $MoO_3$ HIL (corresponding to a metal-oxide hole-injection layer), a first $F_8ZnPc$ HTL (corresponding to organic HTL 1006-1), a first $MoO_3$ IL (corresponding to metal-oxide interlayer 1008-1), a second $F_8ZnPc$ HTL (corresponding to organic HTL 1006-2), a second $MoO_3$ IL (corresponding to metal-oxide interlayer 1008-2), a p-6P layer, a $TAPC:C_{70}$ blend (corresponding to active layers 1010) and a $TPBi:C_{60}$ blend (corresponding to an organic buffer layer), an Ag layer (corresponding to cathode 1012), and a HAT-CN layer (corresponding to an optical anti-reflection layer).

FIG. 19C illustrates a device structure 1900C for an example organic photovoltaic device having a multilayer compound HTL 1902C. Device structure 1900C may correspond to an extension of device structure 1000 described in reference to FIG. 10, and may include a glass substrate (corresponding to substrate 1002), an ITO layer (corresponding to anode 1004), a $MoO_3$ HIL (corresponding to a metal-oxide hole-injection layer), a first $F_8ZnPc$ HTL (corresponding to organic HTL 1006-1), a first $MoO_3$ IL (corresponding to metal-oxide interlayer 1008-1), a second $F_8ZnPc$ HTL (corresponding to organic HTL 1006-2), a second $MoO_3$ IL (corresponding to metal-oxide interlayer 1008-2), a third $F_8ZnPc$ HTL, a third $MoO_3$ IL, a fourth $F_8ZnPc$ HTL, a fourth $MoO_3$ IL, a p-6P layer, a $TAPC:C_{70}$ blend (corresponding to active layers 1010) and a $TPBi:C_{60}$ blend (corresponding to an organic buffer layer), an Ag layer (corresponding to cathode 1012), and a HAT-CN layer (corresponding to an optical anti-reflection layer).

Figure 20:
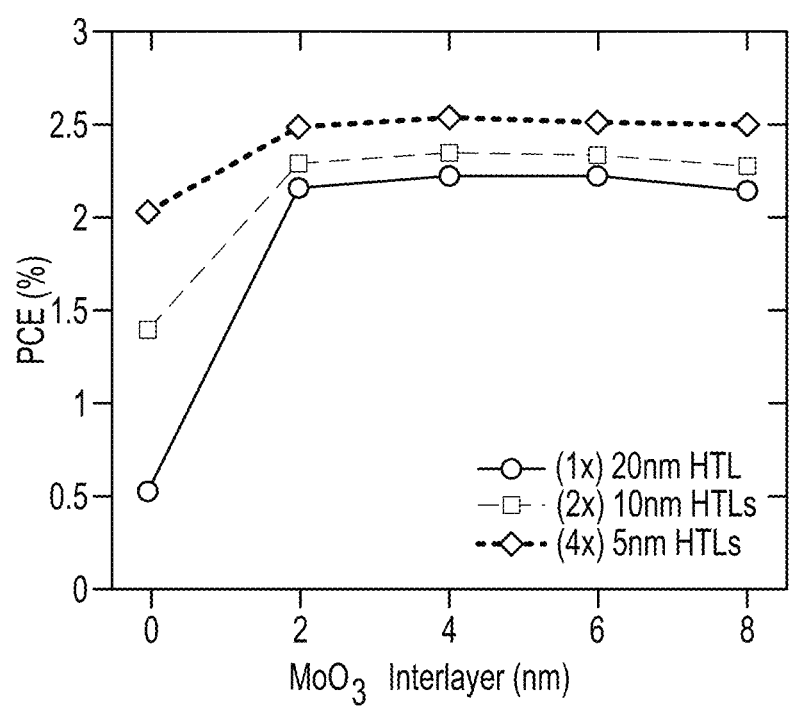
FIG. 20 illustrates a plot showing measured power conversion efficiency as a function of metal-oxide interlayer thickness for a varying number of multilayers and employing the device structures of FIG. 19A-19C.

FIG. 20 illustrates a plot showing the PCE as a function of the top-most metal-oxide interlayer thickness of device structures 1900. The solid line corresponds to device structure 1900A, the dot-dashed line corresponds to device structure 1900B, and the dashed line corresponds to device structure 1900C. FIG. 20 demonstrates that further improvements in the PCE can be achieved by dividing the HTL into smaller and smaller slices separated by metal-oxide interlayers. This further highlights the contact doping effect of the HTL(s) provided by the metal-oxide interlayer(s). Additionally, by splitting a single compound HTL (device structure 900) into multiple compound HTLs (device structure 1000), multiple HTL compounds can be used in the same device structure. This provides a large degree of flexibility for engineering color and absorption of the photovoltaic device.

Figure 21:
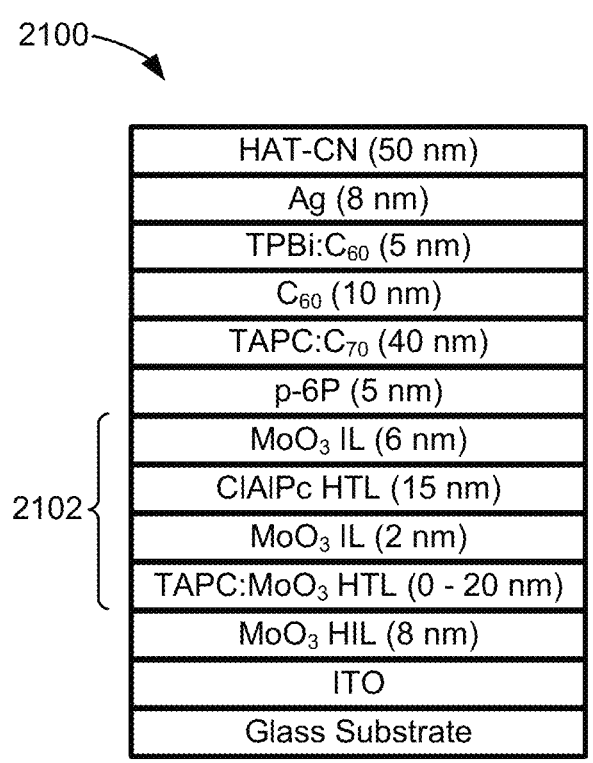
FIG. 21 illustrates a device structure for an example organic photovoltaic device having a multilayer compound HTL comprised of two different HTL materials.

FIG. 21 illustrates a device structure 2100 for an example organic photovoltaic device having a multilayer compound HTL 2102 comprised of two different HTL materials, according to some embodiments of the present invention. Device structure 2100 may correspond to an example implementation of device structure 1000 described in reference to FIG. 10. Accordingly, operation of device structure 2100 may be similar to that described in reference to device structure 1000. Device structure 2100 includes a glass substrate (corresponding to substrate 1002), an ITO layer (corresponding to anode 1004), a $MoO_3$ HIL (corresponding to a metal-oxide hole-injection layer), a $TAPC:MoO_3$ HTL (corresponding to organic HTL 1006-1), a first $MoO_3$ IL (corresponding to metal-oxide interlayer 1008-1), a ClAlPc HTL (corresponding to organic HTL 1006-2), a second $MoO_3$ IL (corresponding to metal-oxide interlayer 1008-2), a p-6P layer, a $TAPC:C_{70}$ blend and $C_{60}$ layer (corresponding to active layers 1010) and a $TPBi:C_{60}$ blend (corresponding to an organic buffer layer), an Ag layer (corresponding to cathode 1012), and a HAT-CN layer (corresponding to an optical anti-reflection layer).

Figure 22A:
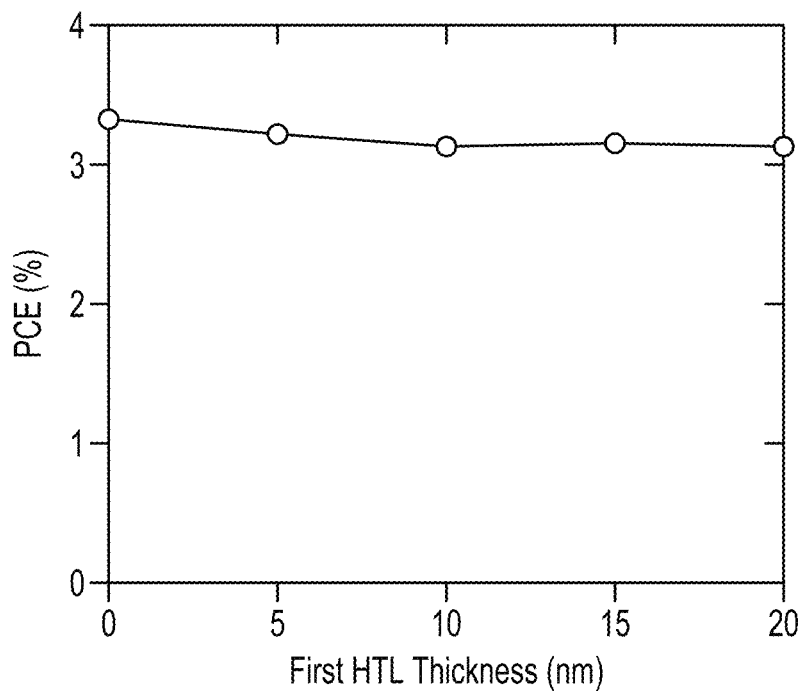
FIG. 22A-22C illustrate plots showing experimental performance and color values acquired for transparent organic photovoltaic devices with a multilayer compound HTL comprised of two different HTL materials and employing the device structure of FIG. 21.
Figure 22B:
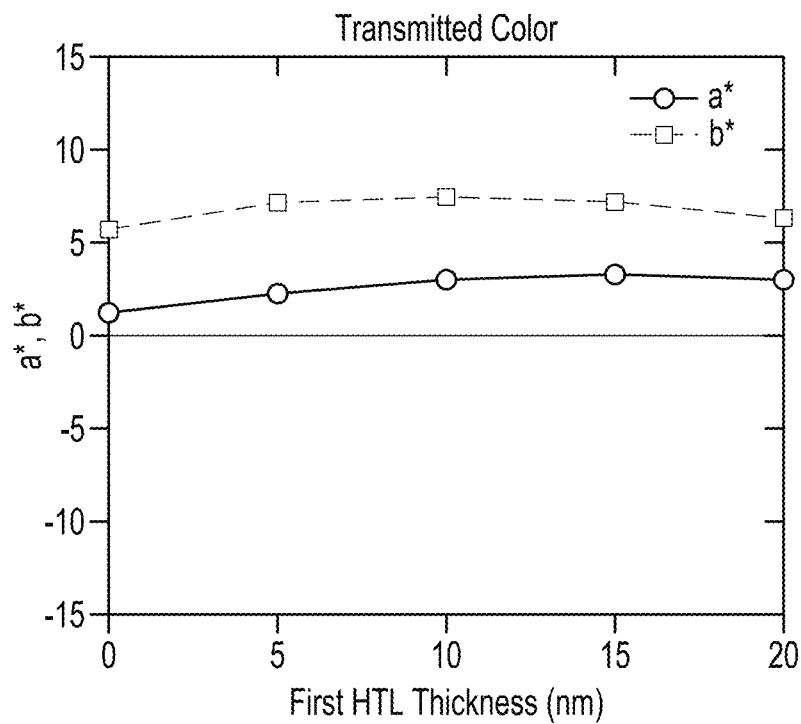
Figure 22C:
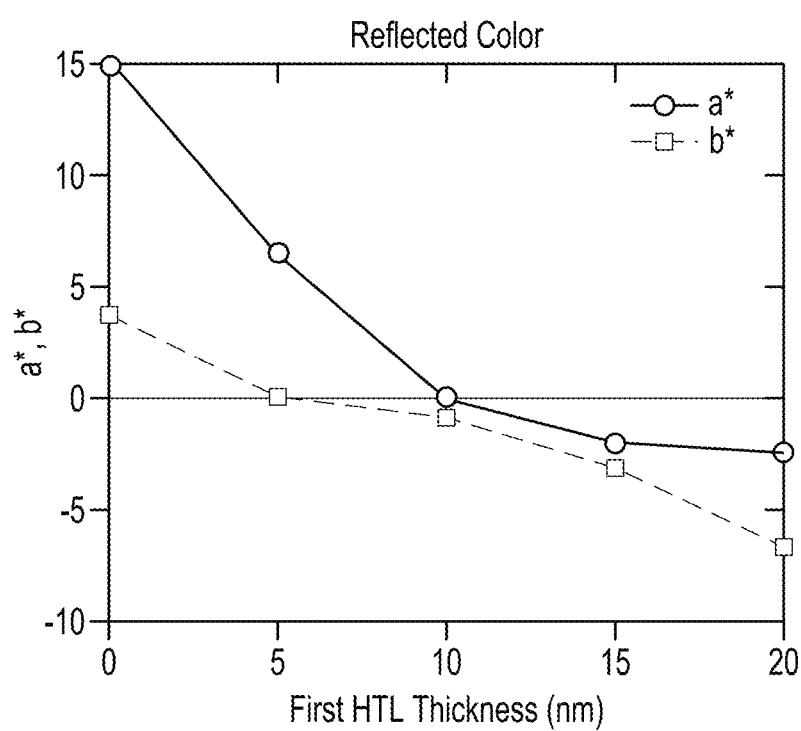

FIG. 22A-22C illustrate plots showing experimental values acquired for an organic photovoltaic device having device structure 2100. FIG. 22A illustrates a plot showing PCE as a function of thickness of the $TAPC:MoO_3$ HTL. FIG. 22B illustrates a plot showing transmitted color parameters a* and b* as a function of thickness of the $TAPC:MoO_3$ HTL. FIG. 22C illustrates a plot showing reflected color parameters a* and b* as a function of thickness of the TAPC:MoO$_3$ HTL. FIG. 22C demonstrates the significant effect that the thickness of one of the HTLs can have on the reflected color, which can be engineered independently of the transmitted color and PCE.

Figure 23:
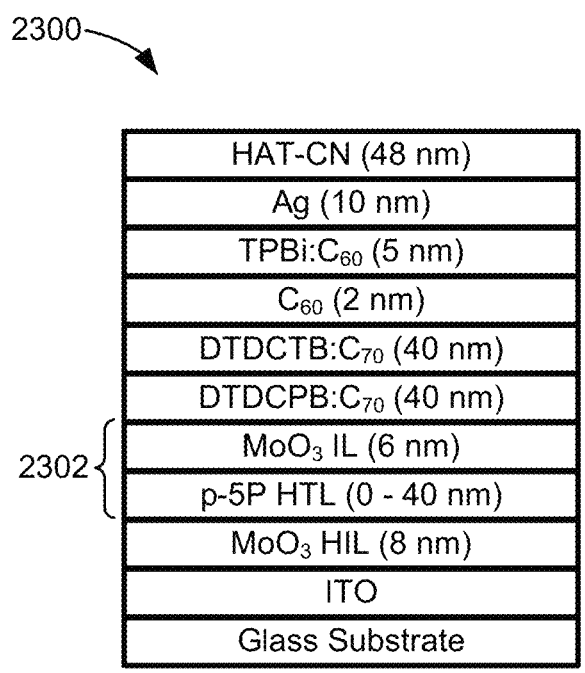
FIG. 23 illustrates a device structure for an example organic photovoltaic device having a single compound HTL and a stacked BHJ active layer architecture.

FIG. 23 illustrates a device structure 2300 for an example organic photovoltaic device having a single compound HTL 2302, according to some embodiments of the present invention. Device structure 2300 may correspond to an example implementation of device structure 900 described in reference to FIG. 9 that includes a single compound HTL comprising a variable p-5P HTL (with a thickness between 0 and 40 nm) and a metal-oxide interlayer. Accordingly, operation of device structure 2300 may be similar to that described in reference to device structure 900. Device structure 2300 includes a glass substrate (corresponding to substrate 902), an ITO layer (corresponding to anode 904), a MoO$_3$ HIL (corresponding to a metal-oxide hole-injection layer), a p-5P HTL (corresponding to organic HTL 906), a MoO$_3$ IL (corresponding to metal-oxide interlayer 908), a DTDCPB:C$_{70}$ blend, a DTDCTB:C$_{70}$ blend, and a C$_{60}$ layer (corresponding to active layers 910), a TPBi:C$_{60}$ layer (corresponding to an organic buffer layer), an Ag layer (corresponding to cathode 912), and a HAT-CN layer (corresponding to an optical anti-reflection layer).

Figure 24A:
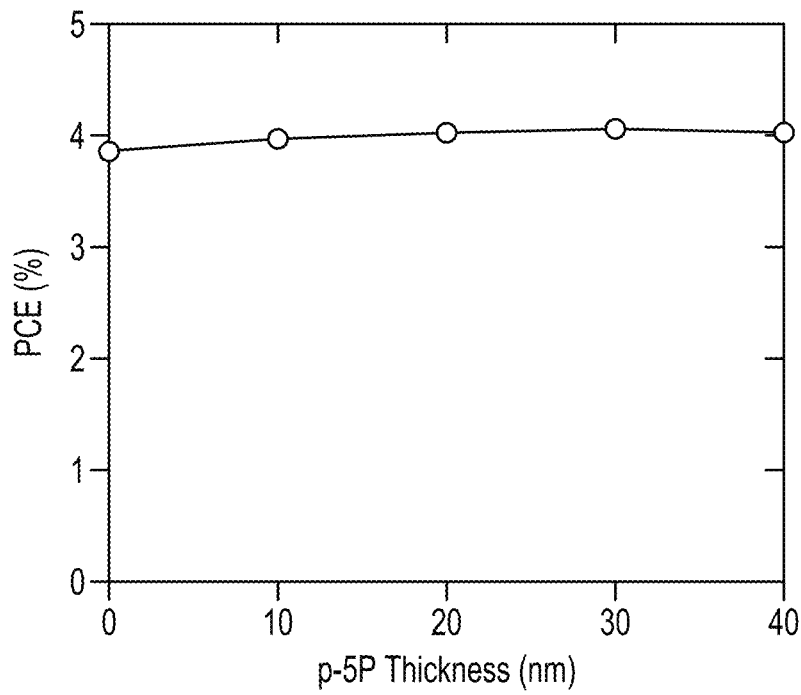
FIG. 24A-24C illustrate plots showing experimental performance and color values acquired for an organic photovoltaic device with a stacked BHJ active layer as a function of organic HTL thickness and employing the device structure of FIG. 23.
Figure 24B:
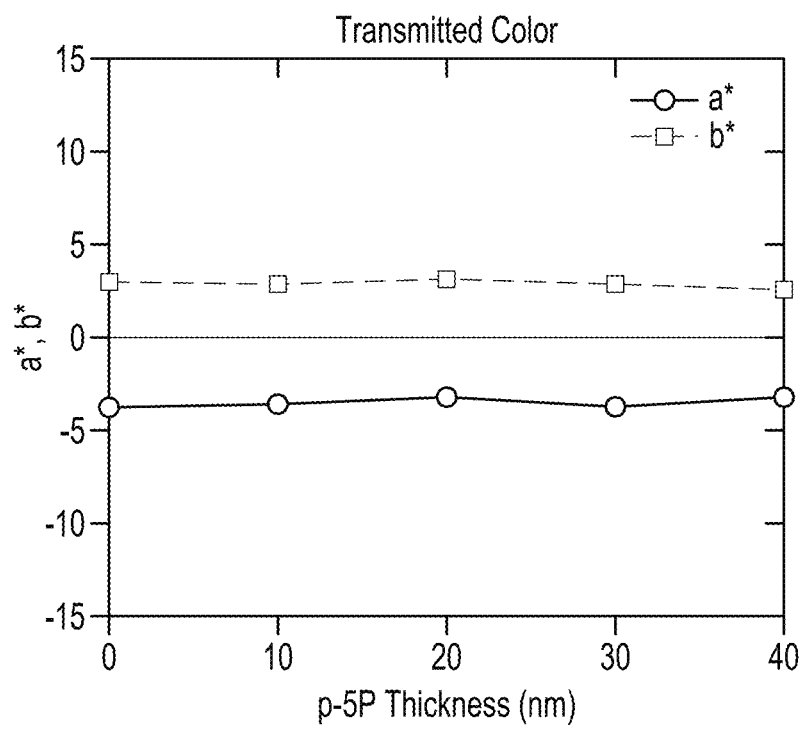
Figure 24C:
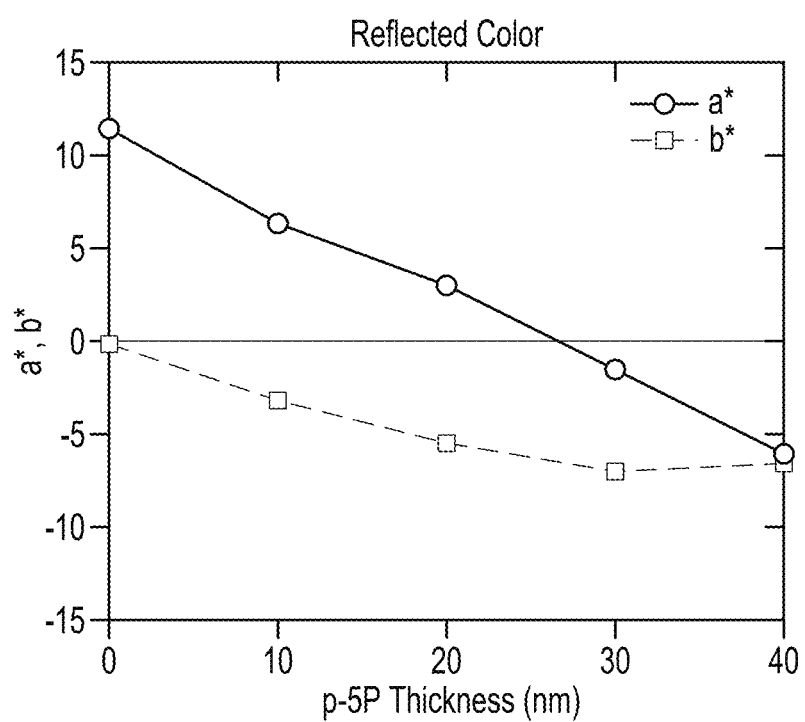

FIG. 24A-24C illustrate plots showing experimental values acquired for an organic photovoltaic device having device structure 2300. FIG. 24A illustrates a plot showing PCE as a function of thickness of the p-5P HTL. FIG. 24B illustrates a plot showing transmitted color parameters a* and b* as a function of thickness of the p-5P HTL. FIG. 24C illustrates a plot showing reflected color parameters a* and b* as a function of thickness of the p-5P HTL. By using a transparent HTL such as p-5P in the compound HTL, the reflected color can be engineered completely independently of either transmitted color or PCE.

Figure 25:
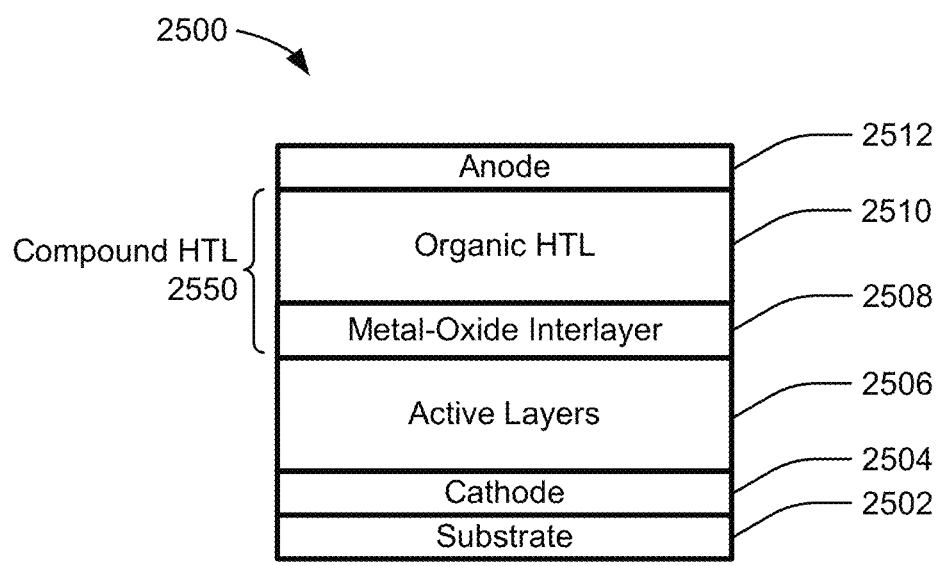
FIG. 25 illustrates a device structure for an example organic photovoltaic device having a single compound HTL in an inverted architecture.

FIG. 25 illustrates a device structure 2500 for an example organic photovoltaic device having a single compound HTL 2550 in an inverted architecture, according to some embodiments of the present invention. Device structure 2500 may include a substrate 2502, a cathode 2504 disposed above and/or formed onto substrate 2502, one or more active layers 2506 disposed above and/or formed onto cathode 2504, a metal-oxide interlayer 2508 disposed above and/or formed onto active layers 2506, an organic HTL 2510 disposed above and/or formed onto metal-oxide interlayer 2508, and an anode 2512 disposed above and/or formed onto organic HTL 2510.

During operation, device structure 2500 receives light that passes through anode 2512 and/or cathode 2502 and is partially absorbed by active layers 2506 (e.g., the UV and/or NIR wavelengths of the received light). The absorbed light causes a separation of charge carriers of opposite types in active layers 2506, with electrons moving from active layers 2506 downward through cathode 2504 and holes moving upward through metal-oxide interlayer 2508, organic HTL 2510, and anode 2512.

In several of the previous examples, the cells were designed such that the anode is deposited first, closest to the substrate, followed by the active layers, followed by the cathode. However, as shown by the illustrated example in FIG. 25, it is also possible to reverse the order such that the cathode is nearest the substrate, followed by the active layers and then the anode. Device structure 2500 may be referred to as an "inverted architecture". Under operation, electrons still flow to the cathode and holes still flow to the anode. In such an architecture, the HTL is deposited atop the active layers prior to deposition of the top electrode. A compound HTL can be used in an inverted architecture as well, as shown in device structure 2500.

Figure 26:
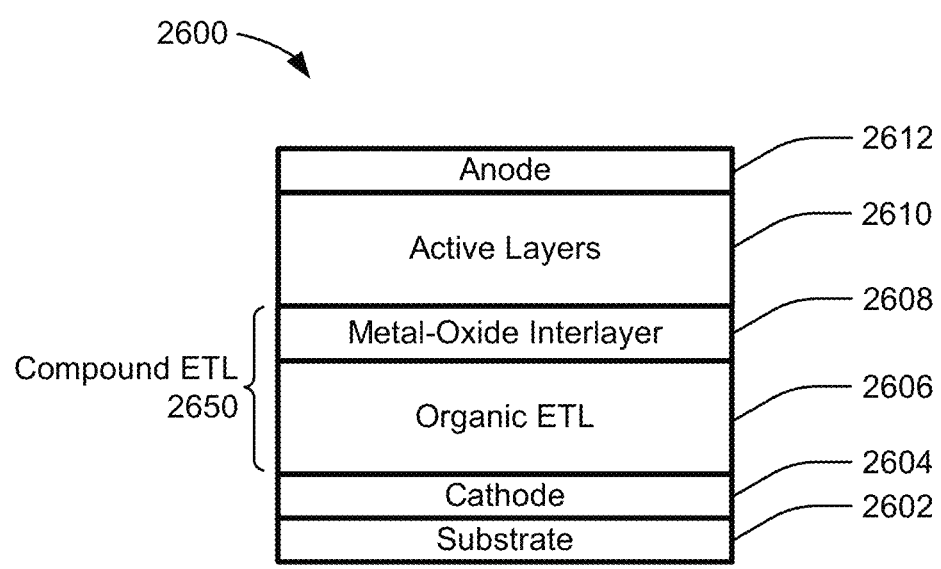
FIG. 26 illustrates a device structure for an example organic photovoltaic device having a single compound ETL in an inverted architecture.

FIG. 26 illustrates a device structure 2600 for an example organic photovoltaic device having a single compound ETL 2650 in an inverted architecture, according to some embodiments of the present invention. Device structure 2600 may include a substrate 2602, a cathode 2604 disposed above and/or formed onto substrate 2602, an organic ETL 2606 disposed above and/or formed onto cathode 2604, a metal-oxide interlayer 2608 disposed above and/or formed onto organic ETL 2606, one or more active layers 2610 disposed above and/or formed onto metal-oxide interlayer 2608, and an anode 2612 disposed above and/or formed onto active layers 2610.

During operation, device structure 2600 receives light that passes through anode 2612 and/or cathode 2604 and is partially absorbed by active layers 2610 (e.g., the UV and/or NIR wavelengths of the received light). The absorbed light causes a separation of charge carriers of opposite types in active layers 2610, with electrons moving from active layers 2610 downward through metal-oxide interlayer 2608, organic ETL 2606, and cathode 2604 and holes moving from active layers 2610 upward through anode 2612.

Figure 27:
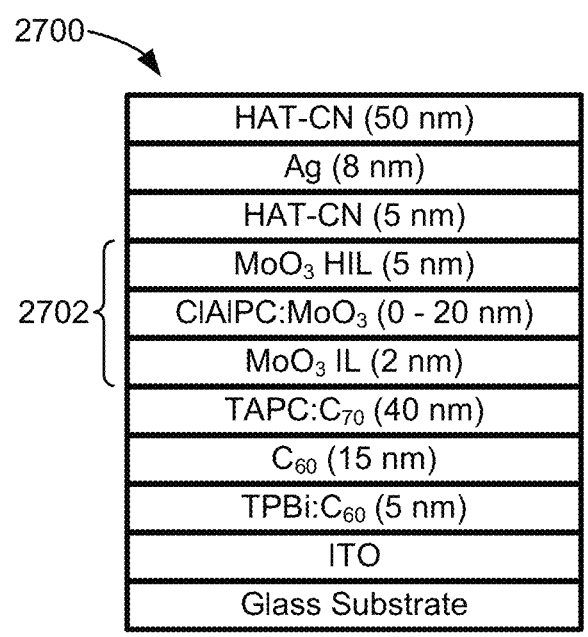
FIG. 27 illustrates a device structure for an example organic photovoltaic device having a single compound HTL in an inverted architecture.

FIG. 27 illustrates a device structure 2700 for an example organic photovoltaic device having a single compound HTL 2702 in an inverted architecture, according to some embodiments of the present invention. Device structure 2700 may correspond to an example implementation of device structure 2500 described in reference to FIG. 25 that includes a single compound HTL. Accordingly, operation of device structure 2700 may be similar to that described in reference to device structure 2500.

Device structure 2700 includes a glass substrate (corresponding to substrate 2502), an ITO layer (corresponding to cathode 2504), a TPBi:C$_{60}$ blend (corresponding to an ETL), a C$_{60}$ layer and a TAPC:C$_{70}$ blend (corresponding to active layers 2506), a MoO$_3$ IL (corresponding to metal-oxide interlayer 2508), a ClAlPC:MoO$_3$ blend (corresponding to organic HTL 2510), a MoO$_3$ HIL (corresponding to a metal-oxide layer), an Ag layer (corresponding to anode 2512), and a HAT-CN layer (corresponding to both a buffer layer and an optical anti-reflection layer).

Figure 28A:
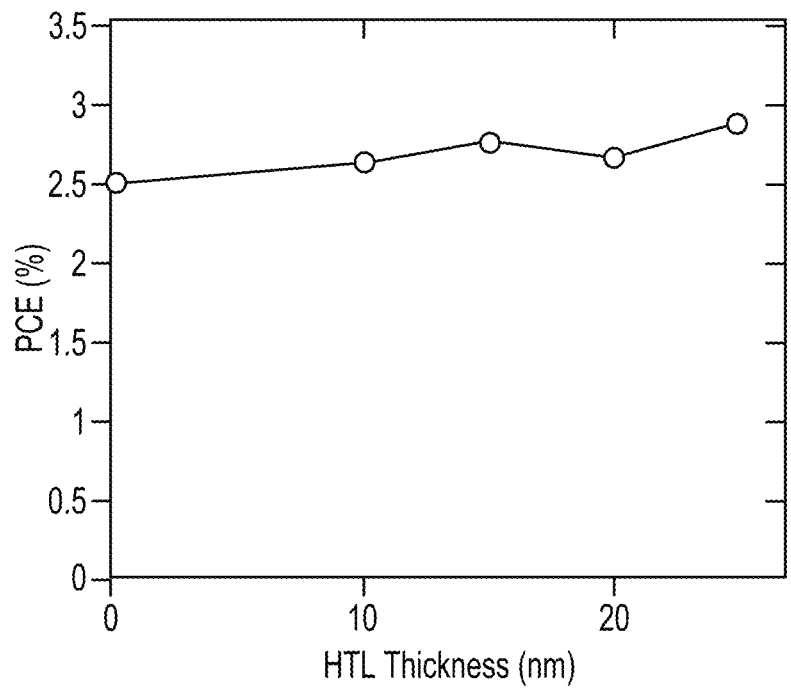
FIGS. 28A and 28B illustrate plots showing experimental values acquired for an organic photovoltaic device having a single compound HTL in an inverted architecture and employing the device structure of FIG. 27.
Figure 28B:
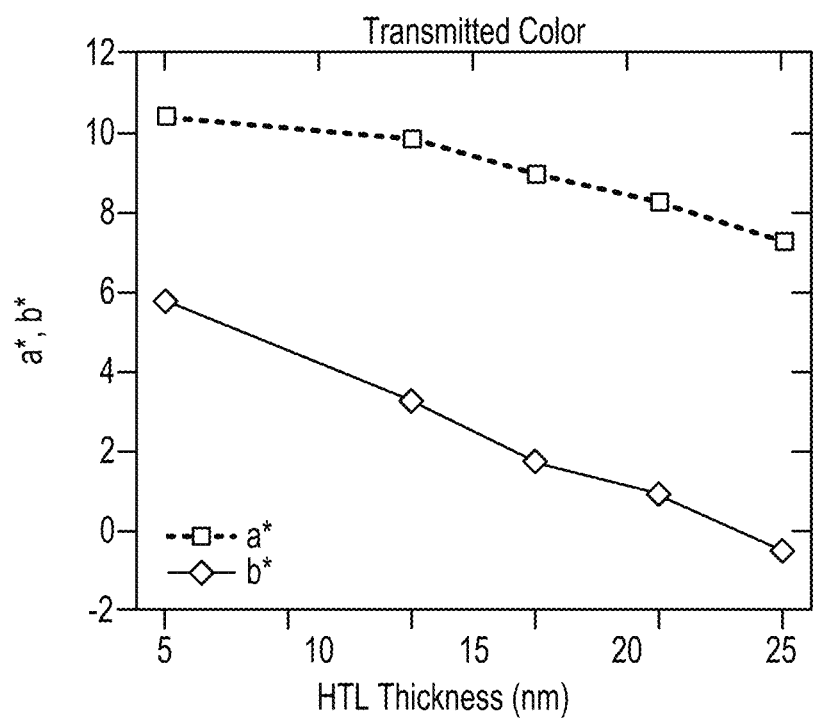

FIGS. 28A and 28B illustrate plots showing experimental values acquired for an organic photovoltaic device having device structure 2700. FIG. 28A illustrates a plot showing PCE as a function of HTL thickness. As shown in FIG. 28A, increasing the thickness of the compound HTL leads to an improvement in power conversion efficiency. FIG. 28B illustrates a plot showing transmitted color parameters a* and b* as a function of HTL thickness. The dashed line corresponds to transmitted color parameter a* and the solid line corresponds to transmitted color parameter b*. When illuminated with white light, the transmitted color of the device changes significantly with ClAlPC thickness due to the selective absorption of that material. The transmission of the semitransparent device shows a significant decrease in transmitted a* and b* leading to a more neutral transmission. Such flexibility in color without loss in performance is desirable in designing transparent photovoltaics.

Figure 29:
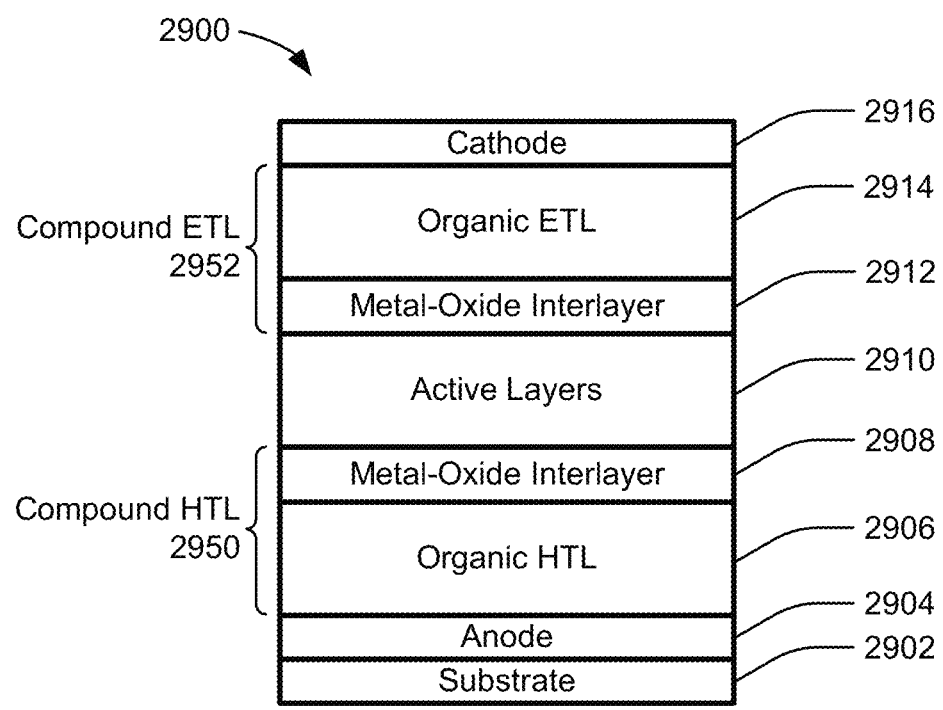
FIG. 29 illustrates a device structure for an example organic photovoltaic device having both a compound HTL and a compound ETL in a conventional architecture.

FIG. 29 illustrates a device structure 2900 for an example organic photovoltaic device having both a compound HTL 2950 and a compound ETL 2952 in a conventional (or non-inverted) architecture, according to some embodiments of the present invention. Device structure 2900 may include a substrate 2902, an anode 2904 disposed above and/or formed onto substrate 2902, an organic HTL 2906 disposed above and/or formed onto anode 2904, a metal-oxide interlayer 2908 disposed above and/or formed onto organic HTL 2906, one or more active layers 2910 disposed above and/or formed onto metal-oxide interlayer 2908, a metal-oxide interlayer 2912 disposed above and/or formed onto active layers 2910, an organic ETL disposed above and/or formed onto metal-oxide interlayer 2912, and a cathode 2916 disposed above and/or formed onto organic ETL 2914.

Figure 30:
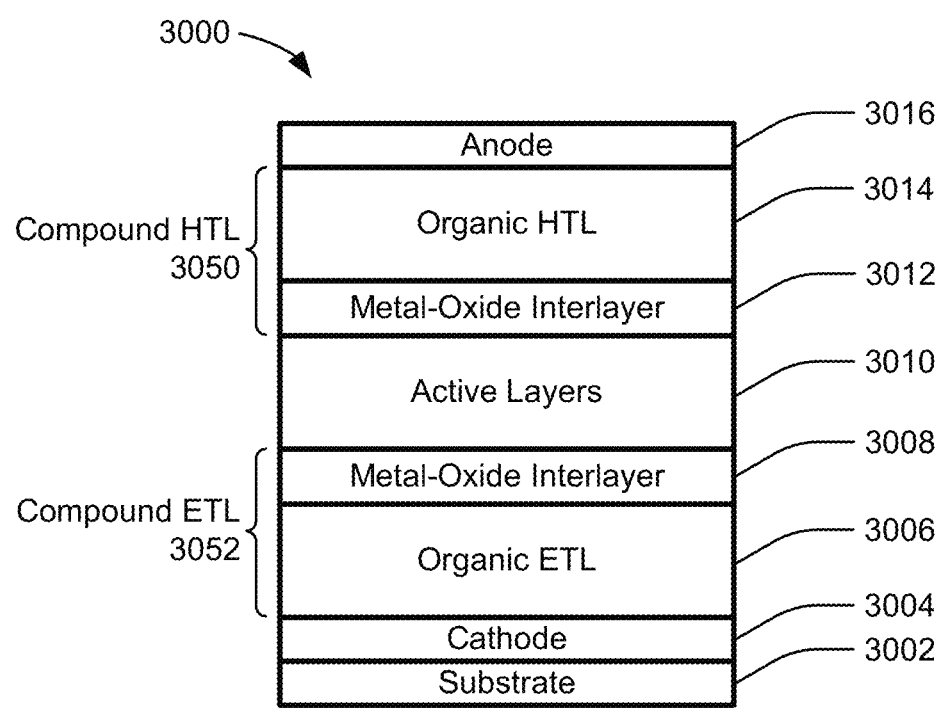
FIG. 30 illustrates a device structure for an example organic photovoltaic device having both a compound HTL and a compound ETL in an inverted architecture.

FIG. 30 illustrates a device structure 3000 for an example organic photovoltaic device having both a compound HTL 3050 and a compound ETL 3052 in an inverted architecture, according to some embodiments of the present invention. Device structure 3000 may include a substrate 3002, a cathode 3004 disposed above and/or formed onto substrate 3002, an organic ETL 3006 disposed above and/or formed onto cathode 3004, a metal-oxide interlayer 3008 disposed above and/or formed onto organic ETL 3006, one or more active layers 3010 disposed above and/or formed onto metal-oxide interlayer 3008, a metal-oxide interlayer 3012 disposed above and/or formed onto active layers 3010, an organic HTL disposed above and/or formed onto metal-oxide interlayer 3012, and an anode 3016 disposed above and/or formed onto organic HTL 3014.

Figure 31:
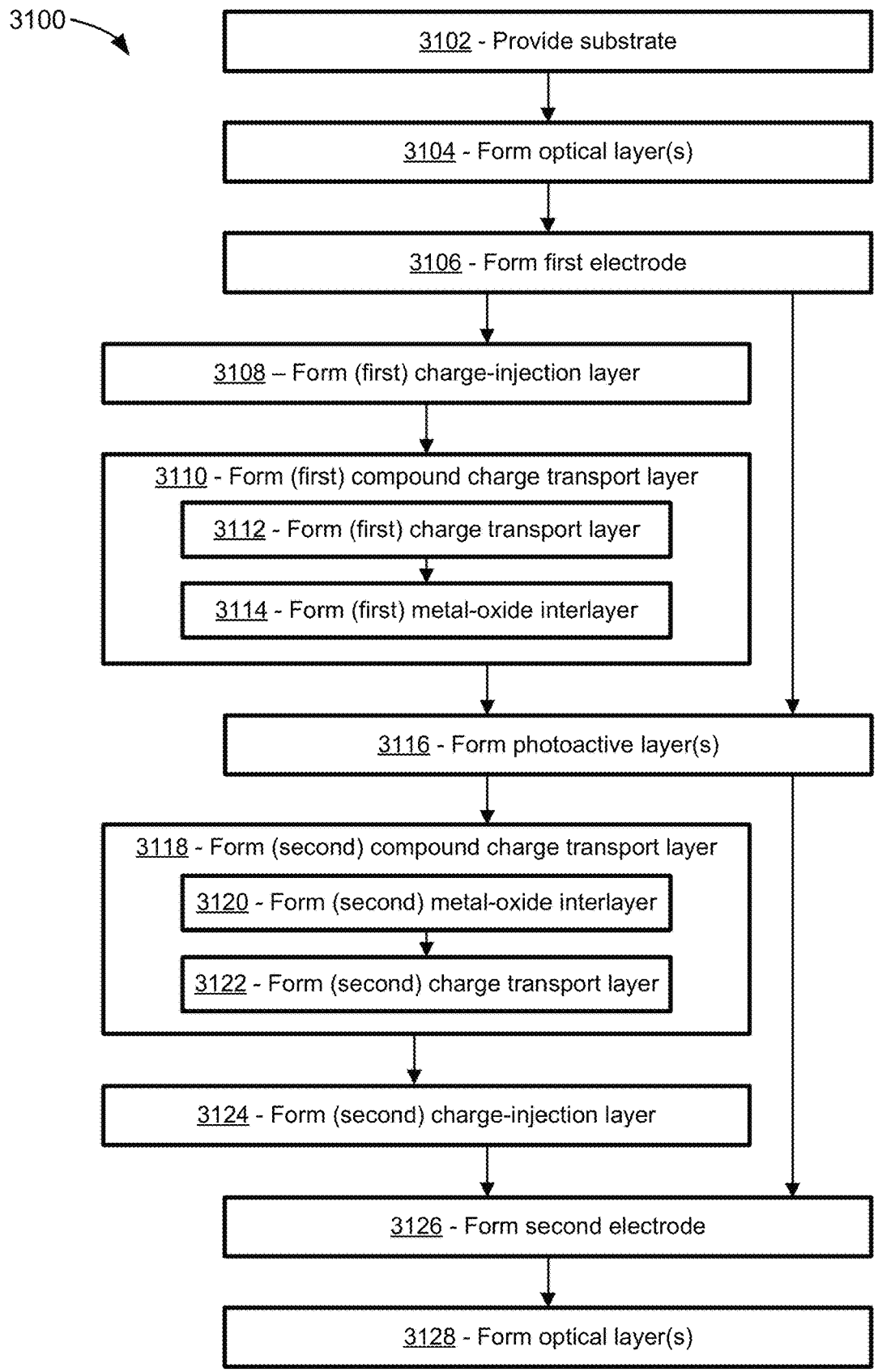
FIG. 31 illustrates a method for making a photovoltaic device.

FIG. 31 illustrates a method 3100 for making a photovoltaic device, such as visibly transparent photovoltaic device 100, device structures 900, 1000, 1100, 1200, 1300, 1700, 1900, 2100, 2300, 2500, 2600, 2700, 2900, 3000, or any combinations thereof. In various embodiments, the photovoltaic device may be visibly transparent or may be non-visibly transparent or opaque. For example, any of the components of the photovoltaic device described in reference to method 3100 may be visibly transparent or non-visibly transparent or opaque. Furthermore, any of the components described in reference to method 3100 as being visibly transparent may, in some embodiments, be non-visibly transparent or opaque. Method 3100 may include additional or fewer steps than is illustrated in FIG. 31. Furthermore, one or more steps of method 3100 may be performed in a different order than is illustrated in FIG. 31.

Method 3100 begins at block 3102, where a substrate is provided, such as, e.g., a transparent substrate. It will be appreciated that useful transparent substrates include visibly transparent substrates, such as glass, plastic, quartz, and the like. Flexible and rigid substrates are useful with various embodiments. Optionally, the transparent substrate is provided with one or more optical layers preformed on top and/or bottom surfaces.

At block 3104, one or more optical layers are optionally formed on or over the transparent substrate, such as on top and/or bottom surfaces of the transparent substrate. Optionally, the one or more optical layers are formed on other materials, such as an intervening layer or material, such as a transparent conductor. Optionally, the one or more optical layers are positioned adjacent to and/or in contact with the visibly transparent substrate. It will be appreciated that formation of optical layers is optional, and some embodiments may not include optical layers adjacent to and/or in contact with the transparent substrate. Optical layers may be formed using a variety of methods including, but not limited to, one or more chemical deposition methods, such as plating, chemical solution deposition, spin coating, dip coating, slot-die coating, blade coating, spray coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition. It will be appreciated that useful optical layers include visibly transparent optical layers. Useful optical layers include those that provide one or more optical properties including, for example, antireflection properties, wavelength selective reflection or distributed Bragg reflection properties, index matching properties, encapsulation, or the like. Useful optical layers may optionally include optical layers that are transparent to ultraviolet and/or near-infrared light. Depending on the configuration, however, some optical layers may optionally provide passive infrared and/or ultraviolet absorption. Optionally, an optical layer may include a visibly transparent photoactive compound described herein.

At block 3106, a first (e.g., bottom) electrode is formed, such as, e.g., a first transparent electrode. As described above, the transparent electrode may correspond to an ITO thin film or other transparent conducting film, such as thin metal films (e.g., Ag, Cu, etc.), multilayer stacks comprising thin metal films (e.g., Ag, Cu, etc.) and dielectric materials, or conductive organic materials (e.g., conducting polymers, etc.). It will be appreciated that transparent electrodes include visibly transparent electrodes. Transparent electrodes may be formed using one or more deposition processes, including vacuum deposition techniques, such as atomic layer deposition, chemical vapor deposition, physical vapor deposition, thermal evaporation, sputter deposition, epitaxy, etc. Solution based deposition techniques, such as spin-coating, may also be used in some cases. In addition, transparent electrodes may be patterned by way of microfabrication techniques, such as lithography, lift off, etching, etc.

At block 3108, a charge-injection layer is formed. The charge-injection layer may be coupled to the first electrode. The charge-injection layer may be a hole-injection layer or an electron-injection layer. The charge-injection layer may be a metal-oxide hole-injection layer or a metal-oxide electron-injection layer. In some embodiments, the charge injection layer is a $MoO_3$ layer having a thickness of approximately 8 nm.

At block 3110, a compound charge transport layer is formed. The compound charge transport layer may be a compound hole transport layer or a compound electron transport layer. In some embodiments, forming the compound charge transport layer may include forming a charge transport layer (block 3112) and forming a metal-oxide interlayer (block 3114). The charge transport layer may be a hold transport layer or an electron transport layer. The charge transport layer may be coupled to the charge injection layer and the metal-oxide interlayer may be coupled to the charge transport layer.

In some implementations, the compound charge transport layer formed at block 3110 is a hole transport layer comprising of one or more of: $F_8ZnPc$, $F_{16}CuPc$, ClAlPc, or TAPC, and the metal-oxide interlayer is comprised of one or more of: $MoO_3$, NiO, $WO_3$, $V_2O_5$, or ITO. In such implementations, the hole transport layer may have a thickness between approximately 5 nm and 25 nm and the metal-oxide interlayer may have a thickness between approximately 2 nm and 8 nm. In some implementations, the compound charge transport layer is an electron transport layer comprising of one or more of ZnO, AZO, FTO, $SnO_2$, Al:$MoO_3$, or $TiO_2$, and the metal-oxide interlayer is comprised of one or more of: $MoO_3$, NiO, $WO_3$, $V_2O_5$, or ITO. In such implementations, the electron transport layer may have a thickness between approximately 5 nm and 25 nm and the metal-oxide interlayer may have a thickness between approximately 2 nm and 8 nm.

At block 3116, one or more photoactive layers are formed, such as on a buffer layer (formed by blocks 3108-3114) or on a transparent electrode (formed by block 3106). The photoactive layers may comprise electron acceptor layers and electron donor layers or co-deposited layers of electron donors and acceptors. Photoactive layers may be formed using a variety of methods including, but not limited to, one or more chemical deposition methods, such as a plating, chemical solution deposition, spin coating, dip coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition.

In some embodiments, block 3116 may include forming one or more BHJ active layers. For example, a first BHJ active layer may be formed comprising a blend of a first electron donor material and a first electron acceptor material and a second BHJ active layer may be formed comprising a blend of a second electron donor material and a second electron acceptor material. The first or second BHJ active layers may be a binary, ternary, quaternary, or a higher-order blend of electron donor materials and electron acceptor materials. In some embodiments, the first BHJ active layer may have a distinct electron donor material from the second BHJ active layer (e.g., the first electron donor material may be different than the second electron donor material). In some embodiments, the first BHJ active layer may share an electron donor material with the second BHJ active layer (e.g., the first electron donor material may be the same as the second electron donor material). In some embodiments, the first BHJ active layer may have a distinct electron acceptor material from the second BHJ active layer (e.g., the first electron acceptor material may be different than the second electron acceptor material). In some embodiments, the first BHJ active layer may share an electron acceptor material with the second BHJ active layer (e.g., the first electron acceptor material may be the same as the second electron acceptor material).

In some embodiments, a p-phenylene layer is formed prior to or subsequent to block 3116. The p-phenylene layer may be formed by vapor depositing p-phenylene on a transparent electrode or on a different buffer layer. For example, the p-phenylene layer may be formed on a $MoO_3$ layer in any of the embodiments described herein. In some embodiments, the material can be deposited from solution, electrochemically, or reactively grown on the surface. In some embodiments, other related materials can be used that achieve a similar efficiency enhancement. The related materials may have similar molecular properties of the disclosed p-phenylene (such as other oligo-phenylenes, or substituted p-phenylenes) and they may be used in combination with other anode layers or buffers instead of the ITO and/or $MoO_3$ layers described herein. In some embodiments, the p-phenylene layer is used in an tandem architecture, in which the p-phenylene is deposited on top of the interconnecting recombination layers, on the anode, or both, with the same general effects for each subcell. In some embodiments, the p-phenylene layer is used in an inverted architecture, in which the anode is deposited on top of the photoactive layer with the same general effects. Other types of solar cells that may benefit from the p-phenylene layer may include lead-halide and other perovskites, quantum dot, and dye sensitized cells.

At block 3118, a compound charge transport layer is formed. The compound charge transport layer may be a compound hole transport layer or a compound electron transport layer. In some embodiments, the compound charge transport layer formed at block 3118 may be a second compound charge transport layer and the compound charge transport layer formed at block 3110 may be a first compound charge transport layer. In some embodiments, forming the compound electron transport layer may include forming a metal-oxide interlayer (block 3120) and forming a charge transport layer (block 3122). The metal-oxide interlayer may be coupled to the photoactive layers and the charge transport layer may be coupled to the metal-oxide interlayer. The compound charge transport layer formed at block 3118 may comprise the same materials described in reference to the compound charge transport layer formed at block 3110.

At block 3124, an charge-injection layer is formed. The charge-injection layer may be coupled to the charge transport layer formed at block 3122. The charge-injection layer may be a hole-injection layer or an electron-injection layer. The charge-injection layer may be a metal-oxide hole-injection layer or a metal-oxide electron-injection layer. In some embodiments, the charge-injection layer formed at block 3124 may be a second charge-injection layer and the charge-injection layer formed at block 3108 may be a first charge-injection layer.

At block 3126, a second (e.g., top) electrode is formed, such as, e.g., a second transparent electrode. The second transparent electrode may be formed on the charge-injection layer formed at block 3124 or on the photoactive layers. The second transparent electrode may be formed using techniques applicable to formation of first transparent electrode at block 3106.

At block 3128, one or more additional optical layers are optionally formed, such as on the second transparent electrode.

Method 3100 may optionally be extended to correspond to a method for generating electrical energy. For example, a method for generating electrical energy may comprise providing a visibly transparent photovoltaic device, such as by making a visibly transparent photovoltaic device according to method 3100. Methods for generating electrical energy may further comprise exposing the visibly transparent photovoltaic device to visible, ultraviolet and/or near-infrared light to drive the formation and separation of electron-hole pairs, for example, for generation of electrical energy. The visibly transparent photovoltaic device may include the visibly transparent photoactive compounds described herein as photoactive materials, buffer materials, and/or optical layers.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

Abbreviations that may be utilized in the present specification include:
TPBi: 2,2',2"-(1,3,5-Benzinetriyl)-tris(1-phenyl-1-H-benzimidazole)
HAT-CN: Dipyrazino[2,3-f: 2',3'-h]quinoxaline-2,3,6,7,10,11-hexacarbonitrile
TAPC: 4,4'-Cyclohexylidenebis[N,N-bis(4-methylphenyl)benzenamine]
$C_{60}$: Fullerene-$C_{60}$
$C_{70}$: Fullerene-$C_{70}$
ClAlPc: Chloroaluminum phthalocyanine
$F_8ZnPc$: Zinc(II) 2,3,9,10,16,17,23,24-octafluorophthalocyanine
$F_{16}CuPc$: Copper(II) 1,2,3,4,8,9,10,11,15,16,17,18,22,23,24,25-hexadecafluoro-29H,31H-phthalocyanine
ZnO: Zinc oxide
p-5P: Para-quinquephenyl
p-6P: Para-sexiphenyl The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered within the scope of this invention as defined by the appended claims.

What is claimed is:

1. An organic photovoltaic device comprising:
   a substrate;
   a first electrode coupled to the substrate;
   a second electrode disposed above the first electrode;
   one or more photoactive layers disposed between the first electrode and the second electrode;
   a compound electron transport layer disposed between the one or more photoactive layers and either the first electrode or the second electrode, wherein the compound electron transport layer includes:
      a first electron transport layer;
      a first metal-oxide interlayer coupled to the first electron transport layer and disposed between the first electron transport layer and the one or more photoactive layers;
      a second electron transport layer; and
      a second metal-oxide interlayer coupled to the second electron transport layer; and
   a compound hole transport layer disposed between the one or more photoactive layers and either the first electrode or the second electrode, wherein the compound hole transport layer includes:
      a hole transport layer; and
      a third metal-oxide interlayer coupled to the hole transport layer and disposed between the hole transport layer and the one or more photoactive layers.

2. The organic photovoltaic device of claim 1, wherein the compound hole transport layer further comprises:
   a second hole transport layer, wherein the hole transport layer is a first hole transport layer; and
   a fourth metal-oxide interlayer coupled to the second hole transport layer.

3. The organic photovoltaic device of claim 1, wherein the first electrode is an anode and the second electrode is a cathode.

4. The organic photovoltaic device of claim 3, wherein the compound hole transport layer is disposed between the one or more photoactive layers and the anode, and wherein the compound electron transport layer is disposed between the one or more photoactive layers and the cathode.

5. The organic photovoltaic device of claim 1, wherein the first electrode is a cathode and the second electrode is an anode.

6. The organic photovoltaic device of claim 5, wherein the compound hole transport layer is disposed between the one or more photoactive layers and the anode, and wherein the compound electron transport layer is disposed between the one or more photoactive layers and the cathode.

7. The organic photovoltaic device of claim 1, wherein the one or more photoactive layers includes a bulk heterojunction photoactive layer comprising a blend of an electron donor material and an electron acceptor material.

8. The organic photovoltaic device of claim 1, wherein the organic photovoltaic device is visibly transparent.

9. The organic photovoltaic device of claim 1, wherein the first electron transport layer and the hole transport layer have distinct spectral absorption properties from the one or more photoactive layers.

10. A method of making an organic photovoltaic device, the method comprising:
    providing a substrate;
    forming a first electrode over the substrate;
    forming a second electrode over the first electrode;
    forming one or more photoactive layers between the first electrode and the second electrode;
    forming a compound electron transport layer between the one or more photoactive layers and either the first electrode or the second electrode, wherein the compound electron transport layer includes:
       a first electron transport layer;
       a first metal-oxide interlayer coupled to the first electron transport layer and disposed between the first electron transport layer and the one or more photoactive layers;
       a second electron transport layer; and
       a second metal-oxide interlayer coupled to the second electron transport layer; and
    forming a compound hole transport layer between the one or more photoactive layers and either the first electrode or the second electrode, wherein the compound hole transport layer includes:
       a hole transport layer; and
       a third metal-oxide interlayer coupled to the hole transport layer and disposed between the hole transport layer and the one or more photoactive layers.

11. The method of claim 10, wherein the compound hole transport layer further comprises:
    a second hole transport layer, wherein the hole transport layer is a first hole transport layer, and
    a fourth metal-oxide interlayer coupled to the second hole transport layer.

12. The method of claim 10, wherein the first electrode is an anode and the second electrode is a cathode.

13. The method of claim 12, wherein the compound hole transport layer is disposed between the one or more photoactive layers and the anode, and wherein the compound electron transport layer is disposed between the one or more photoactive layers and the cathode.

14. The method of claim 10, wherein the first electrode is a cathode and the second electrode is an anode.

15. The method of claim 14, wherein the compound hole transport layer is disposed between the one or more photoactive layers and the anode, and wherein the compound electron transport layer is disposed between the one or more photoactive layers and the cathode.

16. The method of claim 10, wherein the one or more photoactive layers includes a bulk heterojunction photoactive layer comprising a blend of an electron donor material and an electron acceptor material.

17. The method of claim 10, wherein the organic photovoltaic device is visibly transparent.

18. The method of claim 10, wherein the first electron transport layer and the hole transport layer have distinct spectral absorption properties from the one or more photoactive layers.

19. An organic photovoltaic device comprising:
a substrate;
a first electrode coupled to the substrate;
a second electrode disposed above the first electrode;
one or more photoactive layers disposed between the first electrode and the second electrode;
a compound electron transport layer disposed between the one or more photoactive layers and either the first electrode or the second electrode, wherein the compound electron transport layer includes:
an electron transport layer; and
a first metal-oxide interlayer coupled to the electron transport layer and disposed between the electron transport layer and the one or more photoactive layers; and
a compound hole transport layer disposed between the one or more photoactive layers and either the first electrode or the second electrode, wherein the compound hole transport layer includes:
a first hole transport layer;
a second metal-oxide interlayer coupled to the first hole transport layer and disposed between the first hole transport layer and the one or more photoactive layers;
a second hole transport layer; and
a third metal-oxide interlayer coupled to the second hole transport layer.

* * * * *